US011233451B2

(12) United States Patent  
Pahkala et al.

(10) Patent No.: US 11,233,451 B2  
(45) Date of Patent: Jan. 25, 2022

(54) METHODS AND APPARATUS TO BYPASS SENSED SIGNALS IN POWER CONVERTERS

(71) Applicant: Texas Instruments Incorporated, Dallas, TX (US)

(72) Inventors: Janne Matias Pahkala, Oulu (FI); Juha Olavi Hauru, Oulu (FI); Jussi Matti Aleksi Särkkä, Oulunsalo (FI)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 125 days.

(21) Appl. No.: 16/428,563

(22) Filed: May 31, 2019

(65) Prior Publication Data

US 2020/0382001 A1 Dec. 3, 2020

(51) Int. Cl.
| | |
|---|---|
| *H02M 3/157* | (2006.01) |
| *H03K 5/133* | (2014.01) |
| *H03K 5/26* | (2006.01) |
| *H03K 21/38* | (2006.01) |
| *H02M 1/08* | (2006.01) |
| *B60L 1/00* | (2006.01) |
| *H02M 3/158* | (2006.01) |

(Continued)

(52) U.S. Cl.
CPC ............... *H02M 3/157* (2013.01); *B60L 1/00* (2013.01); *H02M 1/08* (2013.01); *H02M 3/158* (2013.01); *H03K 5/133* (2013.01); *H03K 5/26* (2013.01); *H03K 21/38* (2013.01); *H02M 1/0009* (2021.05); *H03K 2005/00058* (2013.01)

(58) Field of Classification Search  
CPC ............. H02M 1/08; H02M 3/158; H02M 2001/0009; B60L 1/00; H03K 5/133; H03K 5/26; H03K 21/38; H03K 2005/00058  
See application file for complete search history.

(56) References Cited

U.S. PATENT DOCUMENTS

| 4,027,215 | A | * | 5/1977 | Knight | ...................... | H02P 6/10 |
|---|---|---|---|---|---|---|
| | | | | | | 318/400.01 |
| 4,291,368 | A | * | 9/1981 | Yarema | ................. | H02M 7/527 |
| | | | | | | 363/41 |
| 7,634,061 | B1 | * | 12/2009 | Turner | .................... | G01T 1/247 |
| | | | | | | 378/62 |

OTHER PUBLICATIONS

Texas Instruments, "LP8733xx Dual High-Current Buck Converter and Dual Linear Regulator," Sep. 2019 (86 pages).

(Continued)

*Primary Examiner* — Dinh T Le  
(74) *Attorney, Agent, or Firm* — Ray A. King; Charles A. Brill; Frank D. Cimino

(57) ABSTRACT

Methods, apparatus, systems and articles of manufacture are disclosed to bypass sensed signals in power converters. The disclosed methods, apparatus, systems and articles of manufacture provide an apparatus to bypass sensed signals in power converters, the apparatus comprising: a first single shot circuit to, during runtime of a power converter, generate a clock signal based on an adaptive delay, the adaptive delay based on a count value of a counter; a pulse comparator coupled to an adaptation pulse generator, the pulse comparator to, during runtime of the power converter: compare a first duration of the adaptation pulse to a second duration of a reference pulse; and adjust the count value of the counter; and a ready detector coupled to the pulse comparator, the ready detector to, in response to a trigger event, (Continued)

transmit, during runtime of the power converter, the count value to a second single shot circuit.

15 Claims, 12 Drawing Sheets

(51) Int. Cl.
*H03K 5/00* (2006.01)
*H02M 1/00* (2006.01)

(56) References Cited

OTHER PUBLICATIONS

Texas Instruments, "LP8733xx-Q1 Dual High-Current Buck Converter and Dual Linear Regulator," Sep. 2018 (85 pages).
Texas Instruments, "LP8756x-Q1 16-A Buck Converter With Integrated Switches," Mar. 2018 (99 pages).
Texas Instruments, "LP87332A-Q1 Dual High-Current Buck Converter and Dual Linear Regulator," Sep. 2017 (75 pages).
Texas Instruments, "LP87332B-Q1 Dual High-Current Buck Converter and Dual Linear Regulator," Jun. 2017 (75 pages).
Texas Instruments, "LP87332D Dual High-Current Buck Converter and Dual Linear Regulator," Nov. 2017 (76 pages).
Texas Instruments, "LP87702-Q1 Dual Buck Converter and 5-V Boost With Diagnostic Functions," Dec. 2017-Revised Jul. 2019 (97 pages).

* cited by examiner

METHODS AND APPARATUS TO BYPASS SENSED SIGNALS IN POWER CONVERTERS

FIELD OF THE DISCLOSURE

This disclosure relates generally to power converters, and, more particularly, to methods and apparatus to bypass sensed signals in power converters.

BACKGROUND

In recent years, automotive vehicle manufacturers have developed advanced automotive vehicles that include a variety of sensors. For example, automotive vehicles include radio detection and ranging (RADAR), light detection and ranging (LIDAR), sound navigation and ranging (SONAR), cameras, and/or other systems including sensors that are suitable to an application in which the automotive vehicle is to be used.

These systems often require high-frequency and/or high duty ratio (e.g., cycle) power modules. In such a high-frequency and/or high duty ratio application, power modules provide the required power using power metal-oxide-semiconductor field-effect transistors (MOSFETs). Power MOSFETs may be used as power delivering devices to support an amperage rating up to hundreds of amperes during operation to deliver the power to a load. In some examples, the load draws current in the range of tens of amperes. Alternatively, systems may use low frequency and/or low duty ratio power modules to provide the power required by an application in which an automotive vehicle is to be used.

Figure 1:
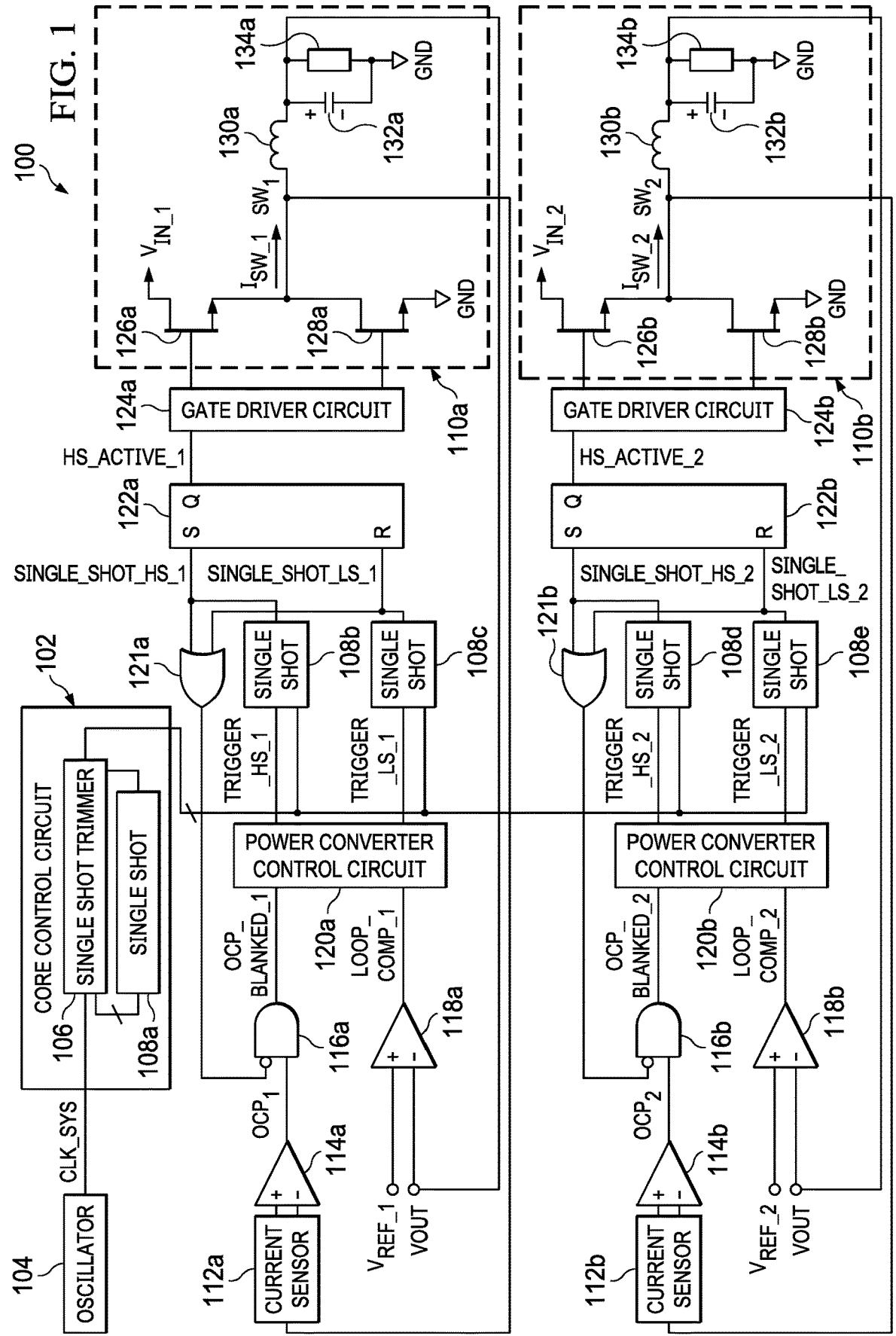
FIG. 1 is a schematic illustration of an example control system for an example power converter.

The figures are not to scale. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. In general, the same reference numbers will be used throughout the drawing(s) and accompanying written description to refer to the same or like parts.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

The examples disclosed herein provide an apparatus to bypass sensed signals in power converters, the apparatus comprising: a first single shot circuit to, during runtime of a power converter, generate a clock signal based on an adaptive delay, the adaptive delay based on a count value of a counter; a pulse comparator coupled to an adaptation pulse generator, the pulse comparator to, during runtime of the power converter: compare a first duration of the adaptation pulse to a second duration of a reference pulse; and adjust the count value of the counter; and a ready detector coupled to the pulse comparator, the ready detector to, in response to a trigger event, transmit, during runtime of the power converter, the count value to a second single shot circuit. As used herein, the term "adapted" is defined as adjusted to compensate for operating conditions of a circuit to maintain a predetermined value.

In recent years, automotive vehicle manufacturers have developed advanced automotive vehicles that include a variety of sensors. For example, automotive vehicles include radio detection and ranging (RADAR), light detection and ranging (LIDAR), sound navigation and ranging (SONAR), cameras, and/or other systems including sensors that are suitable to an application in which the automotive vehicle is to be used.

These systems often require high-frequency and/or high duty ratio power modules. In such a high-frequency and/or high duty ratio application, power modules provide the required power using power MOSFETs. Power MOSFETs may be used as power delivering devices to support an amperage rating up to hundreds of amperes during operation to deliver the power to a load. In some examples, the load draws current in the range of tens of amperes.

In applications that use high-frequency and/or high duty ratio signals to control the power MOSFETS, it is important to monitor the current through the power MOSFETs. The high-frequency switching of the power MOSFETs can cause noise on the sensed signal representative of the current. The noise causes the sensed signal to have a varying settling time, depending on the operating conditions of the power MOSFETs in use. The sensed signal representative of the current is unreliable during the settling time. Accordingly, decision made to continue or discontinue sourcing current during the settling time are likewise unreliable.

In order to reliably control the current through the power MOSFETs, it is advantageous to blank the sensed signal for the current during the settling time. However, because the power MOSFETs are controlled with high-frequency signals, the switching period is very short (e.g., on the scale of tens of nanoseconds) and varies slightly for the high-side and low-side power MOSFETs (e.g., can vary because of the high frequency or because of the duty ratio). Without adapting the length of the blanking period, it is extremely burdensome to reliably control the power MOSFETs. Improperly adapted blanking periods can cause problems when controlling power MOSFETs.

For example, if the blanking period is too long, either the high-side power MOSFET or the low-side power MOSFET will conduct for longer than intended, thereby effecting the duty ratio or switching frequency and output characteristics of the power converter. For example, if either the high-side power MOSFET of the low-side power MOSFET conducts for longer than intended, the current can potentially rise to a level that is outside of the performance specifications for either the high-side power MOSFET or low-side power MOSFET and/or cause the output voltage of the power converter to vary about a value required by the load.

Additionally, if the blanking period is too short, the sensed signal for the current can cause over-current protection mechanisms in the example power converter to open the power MOSFET and stop either the high-side power MOSFET or low-side power MOSFET from conducting. For example, the sensed signal is inaccurate during the settling time due to noise resulting from the high-frequency switching of either the high-side power MOSFET or the low-side power MOSFET. Thus, too short of a blanking period can cause over-current protection mechanisms to improperly fault either the high-side power MOSFET or the low-side power MOSFET, resulting in ineffective operation of the power converter. Thus, a finely tuned blanking period corresponding to the sensed signal settling time is advantageous for controlling the power MOSFETs.

FIG. 1 is a schematic illustration of an example control system 100 for example power converters. The example control system 100 includes an example core control circuit 102 and an example oscillator 104. The example core control circuit 102 includes an example single shot trimmer 106 and an example first single shot circuit 108a. The example control system 100 additionally includes an example second single shot circuit 108b, an example third single shot circuit 108c, an example fourth single shot circuit 108d, and an example fifth single shot circuit 108e.

In the illustrated example of FIG. 1, the example oscillator 104 is coupled to the example single shot trimmer 106. The example single shot trimmer 106 is coupled to the example oscillator 104, the example first single shot circuit 108a, the example second single shot circuit 108b, the example third single shot circuit 108c, the example fourth single shot circuit 108d, and the example fifth single shot circuit 108e. In the example, the example first single shot circuit 108a is coupled to the example single shot trimmer 106.

In the illustrated example, the example control system 100 further includes example power converters 110a, 110b example current sensors 112a, 112b, example comparators 114a, 114b, example logic gates 116a, 116b, and example comparators 118a, 118b. The example control system 100 also includes example power converter control circuits 120a, 120b, example logic gates 121a, 121b, example logic circuits 122a, 122b, and example gate driver circuits 124a, 124b.

In the illustrated example of FIG. 1, the example current sensors 112a, 112b are coupled to respective example power converters 110a, 110b and respective example comparators 114a, 114b. The example comparators 114a, 114b are coupled to respective example current sensors 112a, 112b and respective example logic gates 116a, 116b. In the example, the example logic gate 116a is coupled to the example logic gate 121a, the example comparator 114a, and the example power converter control circuit 120a. The example logic gate 116b is coupled to the example logic gate 121b, the example comparator 114b, and the example power converter control circuit 120b. The example comparators 118a, 118b are coupled to respective example power converter control circuits 120a, 120b, respective example power converters 110a, 110b, and respective reference voltage sources $V_{REF\_1}$, $V_{REF\_2}$ corresponding to a desired output voltage for the example power converter 110a, 110b, respectively.

In the example illustrated in FIG. 1, the example power converter 110a also includes an example high-side switch 126a, an example low-side switch 128a, an example inductor 130a, an example capacitor 132a, and an example load 134a. In the example, the example power converter 110b includes an example high-side switch 126b, an example low-side switch 128b, an example inductor 130b, an example capacitor 132b, and an example load 134b.

In the example, the example power converter control circuit 120a is coupled to the example logic gate 116a, the example comparator 118a, the example second single shot circuit 108b, and the example third single shot circuit 108c. The example power converter control circuit 120b is coupled to the example logic gate 116b, the example comparator 118b, the example fourth single shot circuit 108d, and the example fifth single shot circuit 108e. The example second single shot circuit 108b is coupled to the example single shot trimmer 106, the example power converter control circuit 120a, the example set input of the example logic circuit 122a, and the logic gate 121a. The example third single shot circuit 108c is coupled to the example single shot trimmer 106, the example power converter control circuit 120a, the example reset input of the example logic circuit 122a, and the logic gate 121a. The example fourth single shot circuit 108d is coupled to the example single shot trimmer 106, the example power converter control circuit 120b, the example set input of the example logic circuit 122b, and the logic gate 121b. The example fifth single shot circuit 108e is coupled to the example single shot trimmer 106, the example power converter control circuit 120b, the example reset input of the example logic circuit 122b, and the logic gate 121b.

In the illustrated example, the example logic circuit 122a is coupled to the example second single shot circuit 108b, the example third single shot circuit 108c, the example logic gate 121a, and the example gate driver circuit 124a. The example logic circuit 122*b* is coupled to the example fourth single shot circuit 108*d*, the example fifth single shot circuit 108*e*, the example logic circuit 121*b*, and the example gate driver circuit 124*b*. The example gate driver circuits 124*a*, 124*b* are coupled to respective example logic circuits 122*a*, 122*b* and respective example power converters 110*a*, 110*b*.

In the illustrated example of FIG. 1, the example power converters 110*a*, 110*b* include example input voltage nodes $V_{IN\_1}$, $V_{IN\_2}$ that are referenced to an example ground node GND. The example high-side switches 126*a*, 126*b* include respective drains coupled to the respective input voltage nodes $V_{IN\_1}$, $V_{IN\_2}$. In the example of FIG. 1, the example high-side switches 126*a*, 126*b* include respective sources coupled to respective switch nodes $SW_1$, $SW_2$. The respective switch nodes $SW_1$, $SW_2$ are coupled to the respective drains of the example low-side switches 128*a*, 128*b*. The sources of the respective low-side switches 128*a*, 128*b* are coupled to the ground node GND. The respective switch nodes $SW_1$, $SW_2$ are coupled the respective inductors 130*a*, 130*b*, which are coupled to the respective positive terminals of the respective capacitors 132*a*, 132*b*. The negative terminals of the respective capacitors 132*a*, 132*b* are coupled to the ground node GND. The respective current flowing through the respective switch nodes $SW_1$, $SW_2$ are the currents $I_{SW\_1}$, $I_{SW\_2}$.

In the illustrated example of FIG. 1, each of the example current sensors 112*a*, 112*b* is a device that senses the respective currents $I_{SW\_1}$, $I_{SW\_2}$ in the respective power converters 110*a*, 110*b*. In the illustrated example, each of the example current sensors 112*a*, 112*b* is a combination of a shunt resistor and a voltage source. The example shunt resistor measures the respective currents $I_{SW\_1}$, $I_{SW\_2}$ flowing through the respective power converters 110*a*, 110*b* and outputs a respective voltage corresponding to the respective currents $I_{SW\_1}$, $I_{SW\_2}$. Additionally, each of the example current sensors 112*a*, 112*b* includes the example voltage source to output a respective reference voltage corresponding to respective current limits for the currents $I_{SW\_1}$, $I_{SW\_2}$.

In the illustrated example of FIG. 1, each of the example comparators 114*a*, 114*b* is a device that compares the respective voltage corresponding to the currents $I_{SW\_1}$, $I_{SW\_2}$ and the respective reference voltage corresponding to an example current limits for the currents $I_{SW\_1}$, $I_{SW\_2}$ and outputs respective over current protection (OCP) signals $OCP_1$, $OCP_2$. Each of the example comparators 114*a*, 114*b* outputs a logic high value (e.g., a binary '1') when the respective voltage corresponding to the currents $I_{SW\_1}$, $I_{SW\_2}$ is greater than the respective reference voltage corresponding to the example current limits for the currents $I_{SW\_1}$, $I_{SW\_2}$. Otherwise, each of the example comparators 114*a*, 114*b* outputs a logic low value (e.g., a binary '0'). In the example, each of the example comparators 114*a*, 114*b* is an analog comparator. In other examples, each of the example comparators 114*a*, 114*b* may be a digital comparator, one or more logic gates, or any combination thereof suitable to the application.

In the illustrated example of FIG. 1, each of the example logic gates 116*a*, 116*b* is a device that compares the respective OCP signals $OCP_1$, $OCP_2$ with the respective outputs of respective logic gates 121*a*, 121*b*. In the example, each of the respective logic gates 116*a*, 116*b* is an AND logic gate with one terminal inverted. The example logic gate 116*a* outputs an OCP_blanked_1 signal based on the $OCP_1$ signal and the output of the logic gate 121*a*. The example logic gate 116*b* outputs an OCP_blanked_2 signal based on the $OCP_2$ signal and the output of the logic gate 121*b*. In the example, when the $OCP_1$ signal is high and the output of the logic gate 121*a* is low, the example logic gate 116*a* outputs a logic high value as the OCP_blanked_1 signal. In the example, when the $OCP_2$ signal is high and the output of the logic gate 121*b* is low, the example logic gate 116*b* outputs a logic high value as the OCP_blanked_2 signal. Otherwise, each of the example logic gates 116*a*, 116*b* outputs a logic low value as the OCP_blanked_1 signal and the OCP_blanked_2, respectively. In other examples, each of the example logic gates 116*a*, 116*b* may be an analog comparator, a digital comparator, one or more logic gates, or any combination thereof suitable to the application.

In the illustrated example of FIG. 1, each of the example comparators 118*a*, 118*b* is a device that compares the respective voltages across the loads 134*a*, 134*b* to respective reference voltages $V_{REF\_1}$, $V_{REF\_2}$ corresponding to respective desired voltages across the loads 134*a*, 134*b*. In the example, each of the comparators 118*a*, 118*b* is an analog comparator. In the example, the comparator 118*a* outputs a loop_comp_1 signal based on the voltage across the load 134*a* and a reference voltage $V_{REF\_1}$ corresponding to a desired voltage across the load 134*a*. In the example, when the reference voltage $V_{REF\_1}$ corresponding to the desired output voltage across the load 134*a* is higher than the voltage across the load 134*a*, the example comparator 118*a* outputs a logic high value as the loop_comp_1 signal. Otherwise, the example comparator 118*a* outputs a logic low value as the loop_comp_1 signal. In the example, the comparator 118*b* outputs a loop_comp_2 signal based on the voltage across the load 134*b* and a reference voltage $V_{REF\_2}$ corresponding to a desired voltage across the load 134*b*. In the example, when the reference voltage $V_{REF\_2}$ corresponding to the desired output voltage across the load 134*b* is higher than the voltage across the load 134*b*, the example comparator 118*b* outputs a logic high value as the loop_comp_2 signal. Otherwise, the example comparator 118*b* outputs a logic low value as the loop_comp_2 signal. In other examples, each of the example comparator 118*a*, 118*b* may be a digital comparator, one or more logic gates, or any combination thereof suitable to the application.

In the illustrated example of FIG. 1, each of the example power converter control circuit 120*a*, 120*b* is a device that controls the respective power converters 110*a*, 110*b*. In the illustrated example, each of the example power converter control circuits 120*a*, 120*b* is a combination one or more combinational logic circuits and/or one or more sequential logic circuits that determines when to enable and/or disable the gates of the respective high-side switches 126*a*, 126*b* and the gates of the respective low-side switches 128*a*, 128*b*. In the example, the example power converter control circuit 120*a* outputs a trigger_hs_1 signal and a trigger_ls_1 based on the ocp_blanked_1 signal and the loop_comp_1 signal. In the example, the example power converter control circuit 120*b* outputs a trigger_hs_2 signal and a trigger_ls_2 based on the ocp_blanked_2 signal and the loop_comp_2 signal. In other examples, each of the example power converter control circuits 120*a*, 120*b* may be one or more controllers, one or more application specific integrated circuits (ASICs), one or more processors executing machine readable instructions, or any combination thereof suitable to the application.

In the illustrated example of FIG. 1, the example second single shot circuit 108*b* is a combination of one or more combinational logic circuits and/or one or more sequential logic circuits that generates the single_shot_hs_1 signal based on the trigger_hs_1 signal and one or more signals from the example single shot trimmer 106. In other examples, the example second single shot circuit 108*b* can be implemented by one or more integrated circuits, logic circuits, microprocessors, GPUs, DSPs, or controllers from any desired family or manufacturer. The second single shot circuit 108b may be a semiconductor based (e.g., silicon based) device. In further examples, the example second single shot circuit 108b may be one or more controllers, one or more ASICs, one or more processors executing machine readable instructions, or any combination thereof suitable to the application.

In the illustrated example of FIG. 1, the example third single shot circuit 108c is a combination of one or more combinational logic circuits and/or one or more sequential logic circuits that generates the single_shot_ls_1 signal based on the trigger_ls_1 signal and one or more signals from the example single shot trimmer 106. In other examples, the example third single shot circuit 108c can be implemented by one or more integrated circuits, logic circuits, microprocessors, GPUs, DSPs, or controllers from any desired family or manufacturer. The third single shot circuit 108c may be a semiconductor based (e.g., silicon based) device. In further examples, the example third single shot circuit 108c may be one or more controllers, one or more ASICs, one or more processors executing machine readable instructions, or any combination thereof suitable to the application.

In the illustrated example of FIG. 1, the example fourth single shot circuit 108d is a combination of one or more combinational logic circuits and/or one or more sequential logic circuits that generates the single_shot_hs_2 signal based on the trigger_hs_2 signal and one or more signals from the example single shot trimmer 106. In other examples, the example fourth single shot circuit 108d can be implemented by one or more integrated circuits, logic circuits, microprocessors, GPUs, DSPs, or controllers from any desired family or manufacturer. The fourth single shot circuit 108d may be a semiconductor based (e.g., silicon based) device. In further examples, the example fourth single shot circuit 108d may be one or more controllers, one or more ASICs, one or more processors executing machine readable instructions, or any combination thereof suitable to the application.

In the illustrated example of FIG. 1, the example fifth single shot circuit 108e is a combination of one or more combinational logic circuits and/or one or more sequential logic circuits that generates the single_shot_ls_2 signal based on the trigger_ls_2 signal and one or more signals from the example single shot trimmer 106. In other examples, the example fifth single shot circuit 108e can be implemented by one or more integrated circuits, logic circuits, microprocessors, GPUs, DSPs, or controllers from any desired family or manufacturer. The fifth single shot circuit 108e may be a semiconductor based (e.g., silicon based) device. In further examples, the example fifth single shot circuit 108e may be one or more controllers, one or more ASICs, one or more processors executing machine readable instructions, or any combination thereof suitable to the application.

In the illustrated example of FIG. 1, each of the logic circuits 121a, 121b is an OR gate. In the example, the logic gate 121a receives the single_shot_hs_1 signal and the single_shot_ls_1 signal and performs a logic OR on the signals. In this manner, the logic gate 121a outputs a logic high value when either the single_shot_ls_1 signal and the single_shot_ls_2 signal are logic high values.

In the illustrated example of FIG. 1, each of the example logic circuits 122a, 122b is an SR latch. In the example, the example logic circuit 122a outputs an hs_active_1 signal based on the single_shot_hs_1 signal and the single_shot_ls_1 signal. In the example, the example logic circuit 122a outputs a logic high value as the hs_active_1 signal when the single_shot_hs_1 signal is at a logic high value and outputs a logic low value as the hs_active_1 signal when the single_shot_ls_1 signal is at a logic high value. When the single_shot_hs_1 signal and the single_shot_ls_1 signal are logic low values, the example logic circuit 122a outputs the previous state that the logic circuit 122a was in. In the example, the example logic circuit 122b outputs an hs_active_2 signal based on the single_shot_hs_2 signal and the single_shot_ls_2 signal. In the example, the example logic circuit 122b outputs a logic high value as the hs_active_2 signal when the single_shot_hs_2 signal is at a logic high value and outputs a logic low value as the hs_active_2 signal when the single_shot_ls_2 signal is at a logic high value. When the single_shot_hs_2 signal and the single_shot_ls_2 signal are logic low values, the example logic circuit 122b outputs the previous state that the logic circuit 122b was in. In other examples, each of the example logic circuits 122a, 122b may be one or more controllers, one or more ASICs, one or more processors executing machine readable instructions, or any combination thereof suitable to the application.

In the illustrated example of FIG. 1, each of the example gate driver circuits 124a, 124b is a device that drives the respective gates of the high-side switches 126a, 126b and the respective gates of the low-side switches 128a, 128b. Additionally, the example gate driver circuits 124a, 124b drive the respective gates of the high-side switches 126a, 126b and the respective gates of the low-side switches 128a, 128b synchronously. In this manner, the example gate driver circuits 124a, 124b enable the respective gates of the high-side switches 126a, 126b while disabling the respective gates of the low-side switches 128a, 128b. Also, in this manner, the example gate driver circuits 124a, 124b enable the respective gates of the low-side switches 128a, 128b while disabling the respective gates of the high-side switches 126a, 126b. Furthermore, the example gate driver circuits 124a, 124b ensure that the respective high-side switches 126a, 126b and the respective low-side switches 128a, 128b are not enabled simultaneously. In the illustrated example, each of the example gate driver circuits 124a, 124b is one or more combination logic circuits. In other examples, each of the example gate driver circuits 124a, 124b is one or more controllers, one or more ASICs, one or more processors executing machine readable instructions, or any combination thereof suitable to the application.

In the illustrated example of FIG. 1, each of the example high-side switches 126a, 126b is an example first negative-channel (N-channel) MOSFET and each of the example low-side switches 128a, 128b is an example second N-channel MOSFET. In the example, the respective high-side switches 126a, 126b and the respective low-side switches 128a, 128b control the flow of the respective currents $I_{SW\_1}$, $I_{SW\_2}$ in the respective power converters 110a, 110b. In other examples, each of the example high-side switches 126a, 126b and each of the respective low-side switches 128a, 128b are positive-channel (P-channel) MOSFETs, insulated-gate bipolar transistors (IGBTs), bipolar junction transistors (BJTs), junction gate field-effect transistors (JFETs), or any combination thereof that is suitable to the application.

In the illustrated example of FIG. 1, each of the example inductors 130a, 130b is a discrete inductor. In the illustrated example, the example inductors 130a, 130b temporarily stores energy to facilitate power conversion. In other examples, each of the respective inductors 130a, 130b is one or more inductive elements that may be used to temporarily store energy to facilitate power conversion. In the illustrated example of FIG. 1, each of the example capacitors 132a, 132b is a discrete capacitor. In the illustrated example, the example capacitors 132a, 132b temporarily stores energy to facilitate power conversion. In other examples, each of the example capacitors 132a, 132b is one or more capacitive elements that may be used to temporarily store energy to facilitate power conversion.

In the illustrated example of FIG. 1, each of the example loads 134a, 134b is an automotive subsystem. In the example, the respective loads 134a, 134b is a device that the respective power converters 110a, 110b are to supply power to. For example, each of the respective loads 134a, 134b is an automotive subsystem that includes an application processor. For example, the automotive subsystem is a radio, a display in a vehicle, a vehicle dashboard, or other devices that provide information and/or entertainment in a vehicle. In another example, each of the example loads 134a, 134b is a RADAR subsystem in an automotive vehicle. In other examples, each of the loads 134a, 134b may be a LIDAR subsystem, a SONAR subsystem, one or more camera subsystems, and/or any other suitable sensor subsystem for the application. In further examples, each of the example loads 134a, 134b may be a power steering subsystem in an automotive vehicle, headlight or other lighting subsystem in an automotive vehicle, a windshield wiper subsystem in an automotive vehicle, a defroster subsystem in an automotive vehicle, a starter subsystem in an automotive vehicle, an alternator subsystem in an automotive vehicle, or any other electrical component or subsystem in an automotive vehicle. In further examples, each of the example loads 134a, 134b may be a personal electronic device. For example, each of the respective power converters 110a, 110b could be implemented in a personal electronic device (e.g., a cellular phone, a tablet computer, a laptop, etc.). In further examples, each of the respective loads 134a, 134b is an industrial subsystem such as sensors, test equipment, displays, application processors, or field programmable gate arrays (FPGAs).

In the illustrated example of FIG. 1, each of the example power converters 110a, 110b is a direct current (DC) buck converter. In other examples each of the example power converters 110a, 110b may be a boost converter, a buck-boost converter, a flyback converter, a forward converter, a rectifier, or any other power converter suitable to the application. DC power converters function by temporarily storing input energy in electronic components (e.g. inductors, capacitors, inductive elements, capacitive elements, etc.) and then releasing that energy at the output load at a different voltage. In the power converters 110a, 110b, when the respective high-side switches 126a, 126b are on and the respective low-side switches 128a, 128b are off, respective current flows from the respective input voltage nodes $V_{IN\_1}$, $V_{IN\_2}$ to the respective inductors 130a, 130b, which charge at linear rates. When the respective inductors 130a, 130b are charging, the respective inductors 130a, 130b are storing energy in respective magnetic fields produced by the respective currents $I_{SW\_1}$, $I_{SW\_2}$ flowing through the respective inductors 130a, 130b. Additionally, when the respective high-side switches 126a, 126b are on and the respective low-side switches 128a, 128b are off, the respective capacitors 132a, 132b also charge to the respective desired output voltage level and the respective loads 134a, 134b are supplied with current from the respective input voltage nodes $V_{IN\_1}$, $V_{IN\_2}$. When the respective high-side switches 126a, 126b are off, the respective low-side switches 128a, 128b are on so that respective currents $I_{SW\_1}$, $I_{SW\_2}$ can continue to flow to the respective loads 134a, 134b. The energy that is stored in the respective magnetic fields of the respective inductors 130a, 130b dissipates and as it does so, generates a respective current (e.g., $I_{SW\_1}$, $I_{SW\_2}$) that flows through the respective power converters 110a, 110b and to the respective loads 134a, 134b. When the respective high-side switches 126a, 126b are off, the respective currents $I_{SW\_1}$, $I_{SW\_2}$ flowing through the respective power converters 110a, 110b will be equal in magnitude to the respective current flowing though the respective low-side switches 128a, 128b. The respective currents from the respective inductors 130a, 130b flows to the respective capacitors 132a, 132b and the respective loads 134a, 134b, while the respective capacitors 132a, 132b maintain the respective desired output voltages of the respective power converters 110a, 110b and the respective loads 134a, 134b (e.g., an automotive subsystem) receive the power. The respective currents return to the respective inductors 130a, 130b by flowing through the ground node GND and the respective low-side switches 128a, 128b. The switching pattern noted above allows for continuous current to flow into the respective loads 134a, 134b of the respective power converters 110a, 110b.

In the illustrated example of FIG. 1, the example core control circuit 102 is a combination of one or more combinational logic circuits and/or one or more sequential logic circuits. In other examples, the example core control circuit 102 can be implemented by one or more integrated circuits, logic circuits, microprocessors, graphics processing units (GPUs), digital signal processors (DSPs), or controllers from any desired family or manufacturer. The core control circuit 102 may be a semiconductor based (e.g., silicon based) device. In further examples, the example core control circuit 102 may be one or more controllers, one or more ASICs, one or more processors executing machine readable instructions, or any combination thereof suitable to the application. The example core control circuit 102 is a device that controls one or more operating conditions of one or more power converters (e.g., the power converters 110a, 110b) in an application.

In the illustrated example of FIG. 1, the example oscillator 104 is a device that controls the operating frequency of the example core control circuit 102. In the illustrated example, the example oscillator 104 is a resistor capacitor (RC) oscillator. In other examples, the example oscillator 104 is a ring oscillator, a crystal oscillator, a phase locked loop oscillator, or any other suitable oscillator for the application. The example oscillator 104 generates a system clock signal (e.g., a CLK_SYS signal) at a desired frequency (e.g., 100 Megahertz (MHz).

In the illustrated example of FIG. 1, the example core control circuit 102 includes the example single shot trimmer 106. The example single shot trimmer 106 is a device that trims a single shot signal generated by a single shot circuit (e.g., the example first single shot circuit 108a) according to an operating condition of a power converter. In the example, the example single shot trimmer 106 is a combination of one or more combinational logic circuits and/or one or more sequential logic circuits. In other examples, the example single shot trimmer 106 can be implemented by one or more integrated circuits, logic circuits, microprocessors, GPUs, DSPs, or controllers from any desired family or manufacturer. The single shot trimmer 106 may be a semiconductor based (e.g., silicon based) device. In further examples, the example single shot trimmer 106 may be one or more controllers, one or more ASICs, one or more processors executing machine readable instructions, or any combination thereof suitable to the application.

In the illustrated example of FIG. 1, the example core control circuit 102 includes the example first single shot circuit 108a. The example first single shot circuit 108a is a combination of one or more combinational logic circuits and/or one or more sequential logic circuits that generates a single shot pulse based on one or more input signals from the example single shot trimmer 106. In other examples, the example first single shot circuit 108a can be implemented by one or more integrated circuits, logic circuits, microprocessors, GPUs, DSPs, or controllers from any desired family or manufacturer. The first single shot circuit 108a may be a semiconductor based (e.g., silicon based) device. In further examples, the example first single shot circuit 108a may be one or more controllers, one or more ASICs, one or more processors executing machine readable instructions, or any combination thereof suitable to the application.

In the illustrated example of FIG. 1, the example single shot trimmer 106 trims a single shot signal generated by the example first single shot circuit 108a according to the operating conditions (e.g., die temperature, input voltage variation, etc.) of the respective power converters 110a, 110b. For example, as the temperature of a silicon die on which the example high-side switch 126a and the example low-side switch 128a are fabricated increases, the respective turn-on times and the respective turn-off times of the example high-side switch 126a and the example low-side switch 128a may vary. In such an example, due to the variance in temperature, the duty ratio, and other factors, the duration of a blanking period (e.g., 30 nanoseconds (ns) will similarly vary (e.g., 18 ns-42 ns). Circuitry that generates the blanking period without compensating for this variance cannot properly bypass sensed signals in the control system 100. The example single shot trimmer 106 of the illustrated example of FIG. 1 adapts the duration of the blanking period across small time intervals (e.g., 1 millisecond (ms)) to maintain a predetermined duration (e.g., 30 ns) for the blanking period regardless of the variance in the temperature or other operating conditions. The predetermined duration corresponds to a worse-case scenario of the blanking period, thus allowing for reliable current sensing across all conditions. The single shot trimmer 106 transmits the adapted blanking period to the example second single shot circuit 108b, the example third single shot circuit 108c, the example fourth single shot circuit 108d, and the example fifth single shot circuit 108e. The adapted blanking period allows the example second single shot circuit 108b, the example third single shot circuit 108c, the example fourth single shot circuit 108d, and the example fifth single shot circuit 108e to accurately bypass the sensed signals in the example control system 100 regardless of the operating condition of the control system 100. This adapted blanking period is advantageous to a load (e.g., each of the loads 134a, 134b). For example, an improperly adapted blanking period (e.g., too short or too long) can cause false sensing of signals, perturbations in output voltage, limited output current capability, damage to a power converter (e.g., the power converters 110a, 110b), false interrupt signals that interrupt power delivery to the load, duty ratio limitations, switching frequency limitations, higher ripple voltage on the output voltage, additional noise in a control system (e.g., the control system 100). For example, in a RADAR subsystem in an automotive vehicle, very high switching frequencies are used in a power converter to supply power to a RADAR subsystem to generate the RADAR signals. In such an example, the RADAR subsystem functions more advantageously to a user if the input voltage source has low ripple voltage. Beneficially, an blanking period that is adapted for the operating condition of a power converter allows for stable switching at high frequencies which reduces ripple voltage on the output of a power converter. Additionally, an example RADAR subsystem operates more advantageously to a user if the input switching frequency is outside of normal radio bandwidths (e.g., amplitude modulation (AM) frequency, frequency modulation (FM) frequency, etc.). With an improperly adapted blanking period (e.g., improperly adapted for the operating conditions of the power converter), sufficiently high switching frequencies are not achievable; however, with an adapted blanking period, the high switching frequency that is beneficial to a user are achievable. Furthermore, higher switching frequencies allow for small inductors values (e.g., inductor value <220 nH) that are physically smaller than other inductors to be used in a power converter. The smaller value improves load transient performance and the smaller size decreases the footprint of an inductor in a printed circuit board (PCB) or other circuit.

Figure 2:
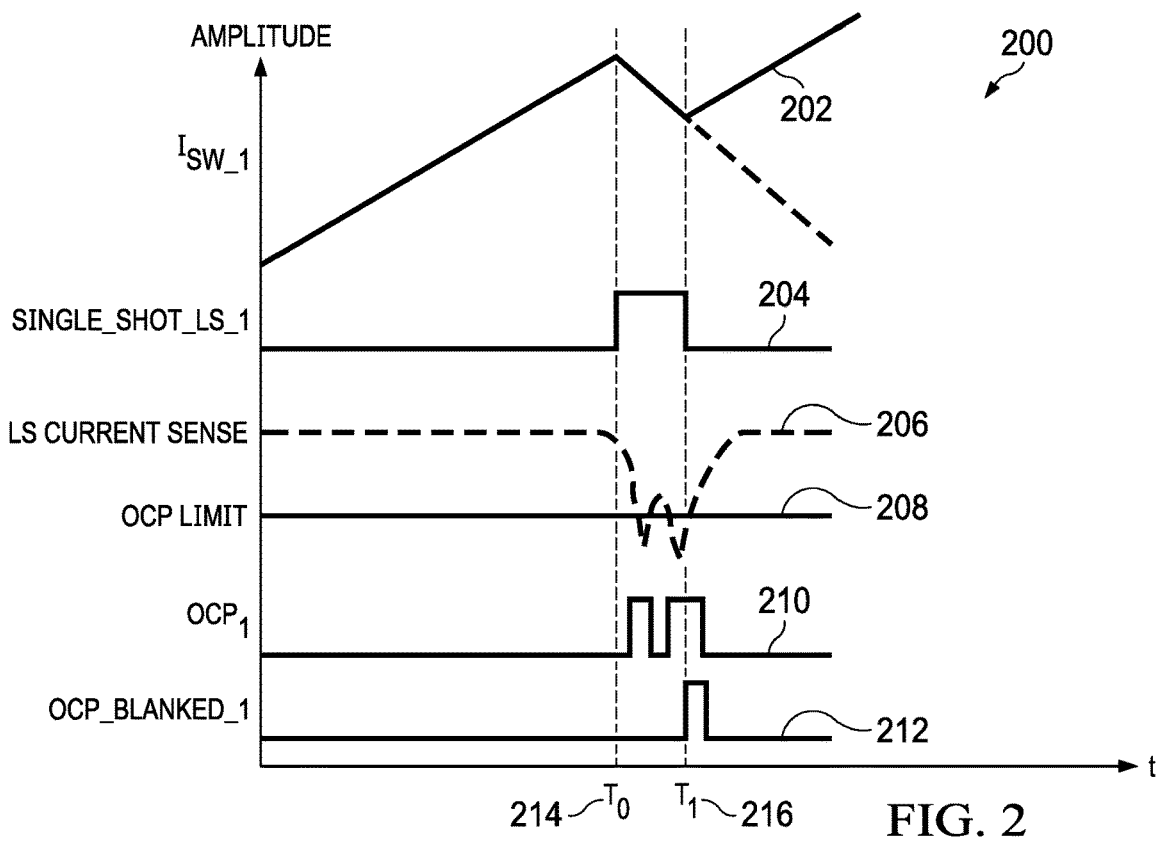
FIG. 2 is a timing diagram illustrating various example signals in the control system of FIG. 1 when an example single shot pulse is too short to bypass a sensed current signal.

FIG. 2 is a timing diagram 200 illustrating various example signals in the control system 100 of FIG. 1 when an example single shot pulse is too short (e.g., shorter than a predetermined duration) to bypass a sensed current signal. The example timing diagram 200 includes an example first curve 202, an example second curve 204, an example third curve 206, an example fourth curve 208, an example fifth curve 210, an example sixth curve 212, an example first time 214 ($T_0$), and an example second time 216 ($T_1$). The example timing diagram 200 includes an amplitude axis and a time axis.

In the illustrated example of FIG. 2, the example first curve 202 represents the current $I_{SW\_1}$ through the example inductor 130a of FIG. 1. The example second curve 204 represents the single shot pulse (e.g., the single_shot_ls_1 signal) generated by the third single shot circuit 108c of FIG. 1. The example third curve 206 represents a current level associated with the current level of the current $I_{SW\_1}$ through the low-side switch 128a of FIG. 1. The example fourth curve 208 represents a current limit (e.g., −3 amps) corresponding to an example current limit for the current $I_{SW\_1}$. The example fifth curve 210 represents the example $OCP_1$ signal generated by the example comparator 114a of FIG. 1. The example sixth curve 212 represents the example OCP_blanked_1 signal generated by the example logic gate 116a of FIG. 1.

In the illustrated example of FIG. 2, prior to the example first time 214, the example high-side switch 126a is enabled and the example low-side switch 128a is disabled. Prior to the example first time 214, the example first curve 202 is increasing at a linear rate, the example second curve 204 is at a logic low value, the example third curve 206 is at a value of 0 amps, the example fourth curve 208 is at a value of −3 amps, the example fifth curve 210 is at a logic low value, and the example sixth curve 212 is at a logic low value.

In the illustrated example of FIG. 2, at the example first time 214, the example gate driver circuit 124a controls the example high-side switch 126a and the example low-side switch 128a to enable the low-side switch 128a and disable the high-side switch 126a while ensuring the example high-side switch 126a and the example low-side switch 128a are not enabled at the same time. At the first time 214, the first curve 202 transitions from increasing at a linear rate to decreasing at a linear rate, the second curve 204 transitions from a logic low value to a logic high value, the third curve 206 begins decreasing from a value of 0 amps, the example fourth curve 208 is at a value of −3 amps, the example fifth curve 210 is at a logic low value, and the sixth curve 212 is at a logic low value.

In the illustrated example of FIG. 2, between the example first time 214 and the example second time 216, the example first curve 202 is decreasing at a linear rate, the example second curve 204 is at a logic high value, the example third curve 206 is oscillating (e.g., settling) between a value of 0 amps and a value of −5 amps, the example fourth curve 208 is at a value of −3 amps, the example fifth curve 210 begins at a logic low value, the example sixth curve 212 begins at a logic low value. Between the example first time 214 and the example second time 216, when the magnitude of the example third curve 206 exceeds the magnitude of the example fourth curve 208, the example fifth curve 210 transitions from a logic low value to a logic high value and maintains a logic high value until the magnitude of the example third curve 206 is less than the magnitude of the example fourth curve 208. Between the example first time 214 and the example fourth time 304, the example sixth curve 212 remains at a logic low value because the example second curve 204 is at a logic high value.

In the illustrated example of FIG. 2, at the example second time 216, the example gate driver circuit 124a of FIG. 1 disables the example low-side switch 128a an enables the example high-side switch 126a because of the single shot pulse is too short. At the second time 216, the first curve 202 transitions from decreasing at a linear rate to increasing at a linear rate, the second curve 204 transitions from a logic high value to a logic low value, the third curve 206 transitions from a value of −5 amps to a value of −2 amps, the fourth curve 208 is at a value of −3 amps, the fifth curve 210 is at a logic high value, and the sixth curve 212 transitions from a logic low value to a logic high value.

In the illustrated example of FIG. 2, after the example second time 216, the example first curve 202 increases at a linear rate, the example second curve 204 is at a logic low value, the example third curve 206 transitions from a value of −5 amps to a value of 0 amps, the example fourth curve 208 is at value of −3 amps, the example fifth curve 210 begins at a logic high value and then transitions to a logic low value, and the example sixth curve 212 begins at a logic high value and then transitions to a logic low value. In other examples disclosed herein, the magnitudes of the first curve 202, the second curve 204, the third curve 206, the fourth curve 208, the fifth curve 210, and the sixth curve 212 may be any suitable magnitude (e.g., the magnitude of the fourth curve 208 may range from −0.0003 A to −3 A) depending on the design of the power converter system in which the example third single shot circuit 108c is implemented.

Figure 3:
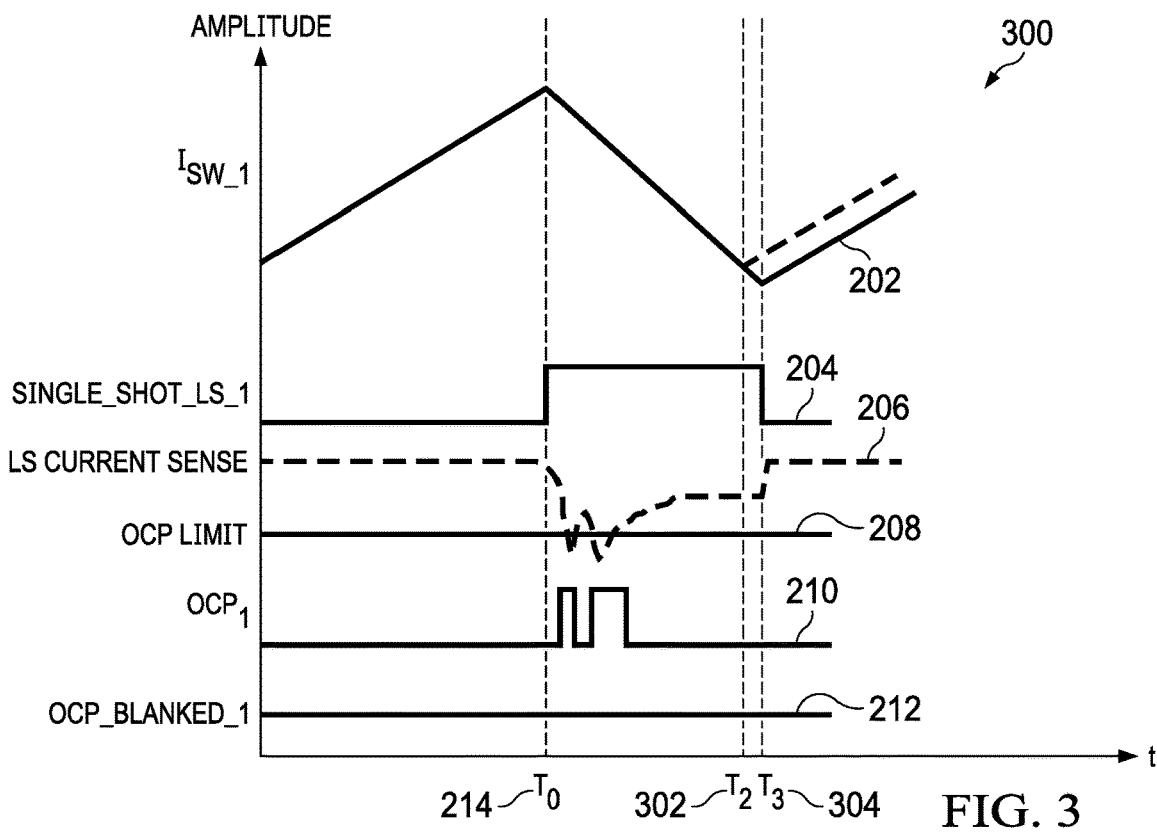
FIG. 3 is a timing diagram illustrating various example signals in the control system of FIG. 1 when an example single shot pulse is too long to bypass a sensed current signal.

FIG. 3 is a timing diagram 300 illustrating various example signals in the control system 100 of FIG. 1 when an example single shot pulse is too long (e.g., longer than a predetermined duration) to bypass a sensed current signal. The example timing diagram 300 includes the example first curve 202, the example second curve 204, the example third curve 206, the example fourth curve 208, the example fifth curve 210, the example sixth curve 212, the example first time 214 ($T_0$), an example third time 302 ($T_2$), and an example fourth time 304 ($T_3$). The example timing diagram 300 includes an amplitude axis and a time axis.

In the illustrated example of FIG. 3, the example first curve 202 represents the current $I_{SW\_1}$ through the example inductor 130a of FIG. 1. The example second curve 204 represents the single shot pulse (e.g., the single_shot_ls_1 signal) generated by the third single shot circuit 108c of FIG. 1. The example third curve 206 represents a current level associated with the current level of the current $I_{SW\_1}$ through the low-side switch 128a of FIG. 1. The example fourth curve 208 represents a current limit (e.g., −3 amps) corresponding to an example current limit for the current $I_{SW\_1}$. The example fifth curve 210 represents the example $OCP_1$ signal generated by the example comparator 114a of FIG. 1. The example sixth curve 212 represents the example OCP_blanked_1 signal generated by the example logic gate 116a of FIG. 1.

In the illustrated example of FIG. 3, prior to the example first time 214, the example high-side switch 126a is enabled and the example low-side switch 128a is disabled. Prior to the example first time 214, the example first curve 202 is increasing at a linear rate, the example second curve 204 is at a logic low value, the example third curve 206 is at a value of 0 amps, the example fourth curve 208 is at a value of −3 amps, the example fifth curve 210 is at a logic low value, and the example sixth curve 212 is at a logic low value.

In the illustrated example of FIG. 3, at the example first time 214, the example gate driver circuit 124a controls the example high-side switch 126a and the example low-side switch 128a to enable the low-side switch 128a and disable the high-side switch 126a while ensuring the example high-side switch 126a and the example low-side switch 128a are not enabled at the same time. At the first time 214, the first curve 202 transitions from increasing at a linear rate to decreasing at a linear rate, the second curve 204 transitions from a logic low value to a logic high value, the third curve 206 begins decreasing from a value of 0 amps, the example fourth curve 208 is at a value of −3 amps, the example fifth curve 210 is at a logic low value, and the sixth curve 212 is at a logic low value.

In the illustrated example of FIG. 3, between the example first time 214 and the example fourth time 304, the example first curve 202 is decreasing at a linear rate, the example second curve 204 is at a logic high value, the example third curve 206 is oscillating (e.g., settling) between a value of 0 amps and a value of −5 amps until the example third curve 206 settles at a value of −2 amps, the example fourth curve 208 is at a value of −3 amps, the example fifth curve 210 begins at a logic low value, the example sixth curve 212 begins at a logic low value. Between the example first time 214 and the example fourth time 304, when the magnitude of the example third curve 206 exceeds the magnitude of the example fourth curve 208, the example fifth curve 210 transitions from a logic low value to a logic high value and maintains a logic high value until the magnitude of the example third curve 206 is less than the magnitude of the example fourth curve 208. Between the example first time 214 and the example fourth time 304, the example sixth curve 212 remains at a logic low value because the example second curve 204 is at a logic high value.

In the illustrated example of FIG. 3, the example third time 302 represents the time at which the example gate driver circuit 124a is to disable the example low-side switch 128a and enable the example high-side switch 126a. However, because the single_shot_ls_1 pulse on the example second curve 204 is too long, the example low-side switch 128a is enabled and the example high-side switch 126a is disabled for a longer time than desired for the application. The length of the extra time that the example low-side switch 128a is enabled and the example high-side switch 126a is disabled for is the time between the example third time 302 and the example fourth time 304.

In the illustrated example of FIG. 3, at the example fourth time 304, the example gate driver circuit 124a of FIG. 1 disables the example low-side switch 128a an enables the example high-side switch 126a. At the fourth time 304, the first curve 202 transitions from decreasing at a linear rate to increasing at a linear rate, the second curve 204 transitions from a logic high value to a logic low value, the third curve 206 transitions from a value of −2 amps to a value of 0 amps, the fourth curve 208 is at a value of −3 amps, the fifth curve 210 is at a logic low value, and the sixth curve 212 is at a logic low value.

In the illustrated example of FIG. 3, after the example fourth time 304, the example first curve 202 increases at a linear rate, the example second curve 204 is at a logic low value, the example third curve 206 transitions from a value of −2 amps to a value of 0 amps, the example fourth curve 208 is at value of −3 amps, the example fifth curve 210 is at a logic low value, and the example sixth curve 212 is at a logic low value. In other examples disclosed herein, the magnitudes of the first curve 202, the second curve 204, the third curve 206, the fourth curve 208, the fifth curve 210, and the sixth curve 212 may be any suitable magnitude (e.g., the magnitude of the fourth curve 208 may range from −0.0003 A to −3 A) depending on the design of the power converter system in which the example third single shot circuit 108c is implemented.

Figure 4:
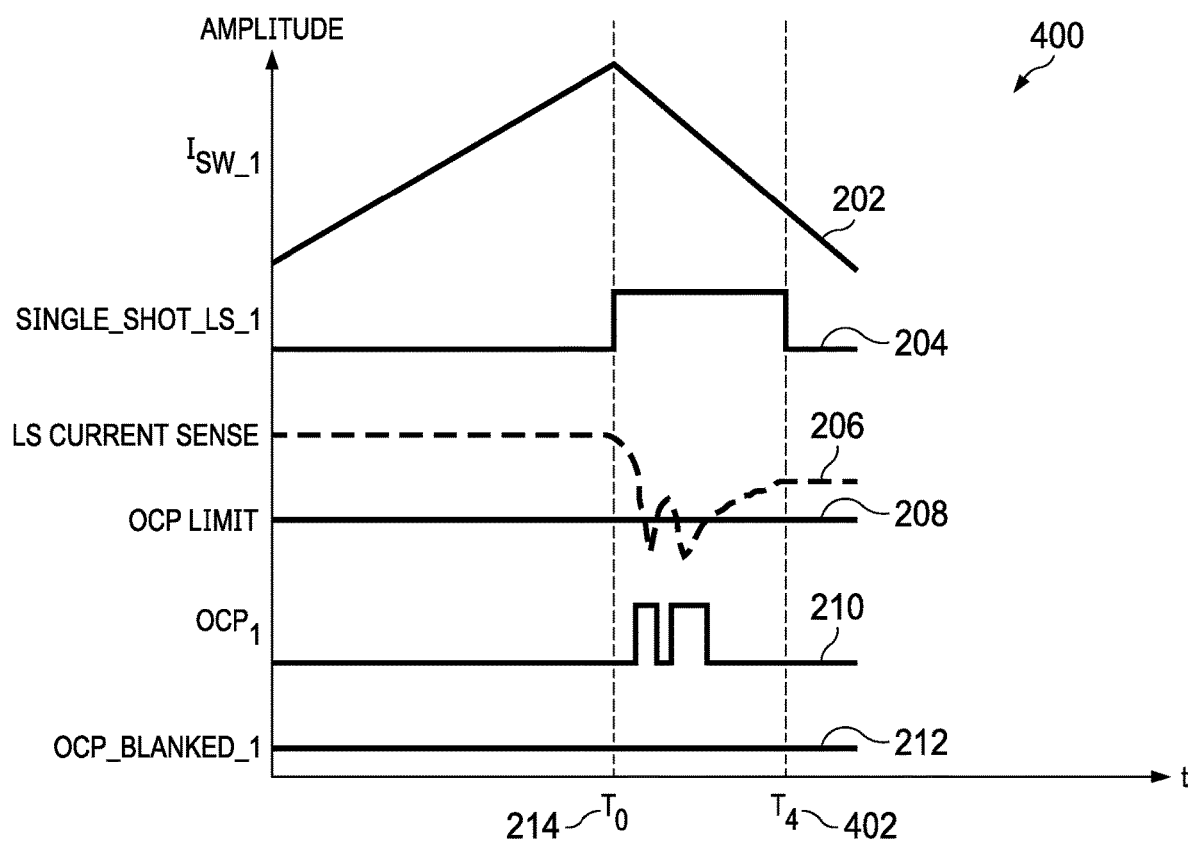
FIG. 4 is a timing diagram illustrating various example signals in the control system of FIG. 1 when an example single shot pulse is properly adapted to bypass a sensed current signal.

FIG. 4 is a timing diagram 400 illustrating various example signals in the control system 100 of FIG. 1 when an example single shot pulse is properly adapted (e.g., matches a predetermined duration) to bypass a sensed current signal. The example timing diagram 400 includes the example first curve 202, the example second curve 204, the example third curve 206, the example fourth curve 208, the example fifth curve 210, the example sixth curve 212, the example first time 214 ($T_0$), and an example fifth time 402 ($T_4$). The example timing diagram 400 includes an amplitude axis and a time axis.

In the illustrated example of FIG. 4, the example first curve 202 represents the current $I_{SW\_1}$ through the example inductor 130a of FIG. 1. The example second curve 204 represents the single shot pulse (e.g., the single_shot_ls_1 signal) generated by the third single shot circuit 108c of FIG. 1. The example third curve 206 represents a current level associated with the current level of the current $I_{SW\_1}$ through the low-side switch 128a of FIG. 1. The example fourth curve 208 represents a current limit (e.g., −3 amps) corresponding to an example current limit for the current $I_{SW\_1}$. The example fifth curve 210 represents the example $OCP_1$ signal generated by the example comparator 114a of FIG. 1. The example sixth curve 212 represents the example OCP_blanked_1 signal generated by the example logic gate 116a of FIG. 1.

In the illustrated example of FIG. 4, prior to the example first time 214, the example high-side switch 126a is enabled and the example low-side switch 128a is disabled. Prior to the example first time 214, the example first curve 202 is increasing at a linear rate, the example second curve 204 is at a logic low value, the example third curve 206 is at a value of 0 amps, the example fourth curve 208 is at a value of −3 amps, the example fifth curve 210 is at a logic low value, and the example sixth curve 212 is at a logic low value.

In the illustrated example of FIG. 4, at the example first time 214, the example gate driver circuit 124a controls the example high-side switch 126a and the example low-side switch 128a to enable the low-side switch 128a and disable the high-side switch 126a while ensuring the example high-side switch 126a and the example low-side switch 128a are not enabled at the same time. At the first time 214, the first curve 202 transitions from increasing at a linear rate to decreasing at a linear rate, the second curve 204 transitions from a logic low value to a logic high value, the third curve 206 begins decreasing from a value of 0 amps, the fourth curve 208 is at a value of −3 amps, the fifth curve 210 is at a logic low value, and the sixth curve 212 is at a logic low value.

In the illustrated example of FIG. 4, between the example first time 214 and the example fifth time 402, the example first curve 202 is decreasing at a linear rate, the example second curve 204 is at a logic high value, the example third curve 206 is oscillating (e.g., settling) between a value of 0 amps and a value of −5 amps until the example third curve 206 settles at a value of −2 amps, the example fourth curve 208 is at a value of −3 amps, the example fifth curve 210 begins at a logic low value, the example sixth curve 212 is at a logic low value. Between the example first time 214 and the example fifth time 402, when the magnitude of the example third curve 206 exceeds the magnitude of the example fourth curve 208, the example fifth curve 210 transitions from a logic low value to a logic high value and maintains a logic high value until the magnitude of the example third curve 206 is less than the magnitude of the example fourth curve 208. Between the example first time 214 and the example fifth time 402, the example sixth curve 212 remains at a logic low value because the example second curve 204 is at a logic high value.

In the illustrated example of FIG. 4, after the example fifth time 402, the example low-side switch 128a continues to be enabled and the example high-side switch 126a continues to be disabled. After the example fifth time 402, the example first curve 202 continues to decrease at a linear rate, the example second curve 204 begins at a logic high value, the example third curve 206 settles at a value of −2 amps, the example fourth curve 208 is at value of −3 amps, the example fifth curve 210 is at a logic low value, and the example sixth curve 212 is at a logic low value. After the example fifth time 402, the example second curve 204 remains at a logic high value for a short amount of time to ensure that the example third curve 206 has settled at a steady state value (e.g., −2 amps). The example second curve 204 then transitions from a logic high value to a logic low value. Between the example first time 214 and the example fifth time 402 the example sixth curve 212 remains at a logic low value and does not transition from a logic low value to a logic high value because the single_shot_ls_1 pulse on the example second curve 204 is finely tuned to be long enough to compensate for the oscillating on the example third curve 206 but not too long that it increases the duty ratio of the low-side switch 128a. Moreover, the example single shot pulse (e.g., the single_shot_ls_1 pulse) is properly adapted (e.g., adjusted to match a predetermined duration) to the operating conditions of the power converter 110a and proper and beneficial operation of the power converter 110a is possible. In other examples disclosed herein, the magnitudes of the first curve 202, the second curve 204, the third curve 206, the fourth curve 208, the fifth curve 210, and the sixth curve 212 may be any suitable magnitude (e.g., the magnitude of the fourth curve 208 may range from −0.0003 A to −3 A) depending on the design of the power converter system in which the example third single shot circuit 108c is implemented.

Figure 5A:
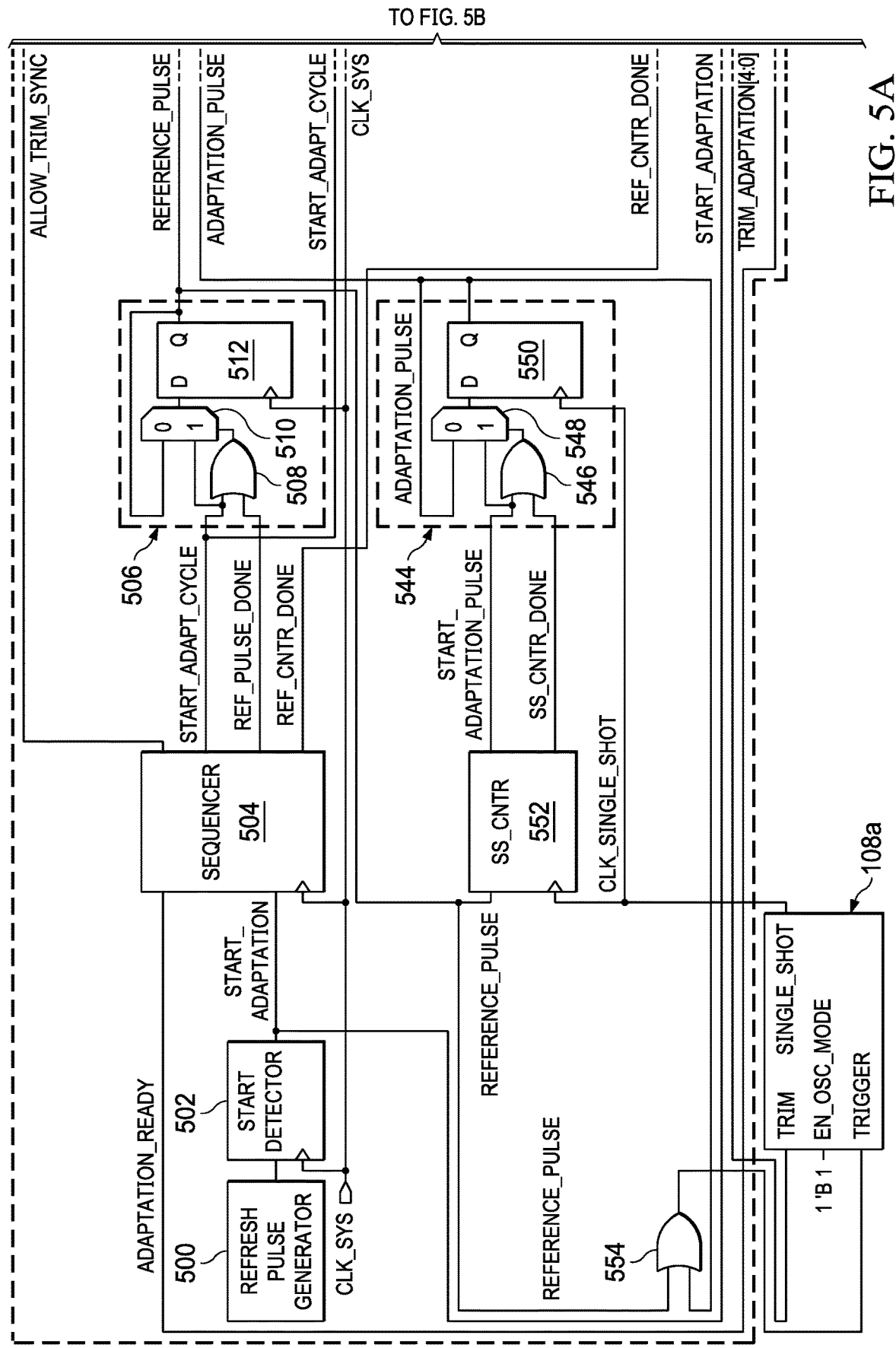
FIGS. 5A and 5B are schematic illustrations showing further detail of an example implementation of the core control circuit of FIG. 1.
Figure 5B:
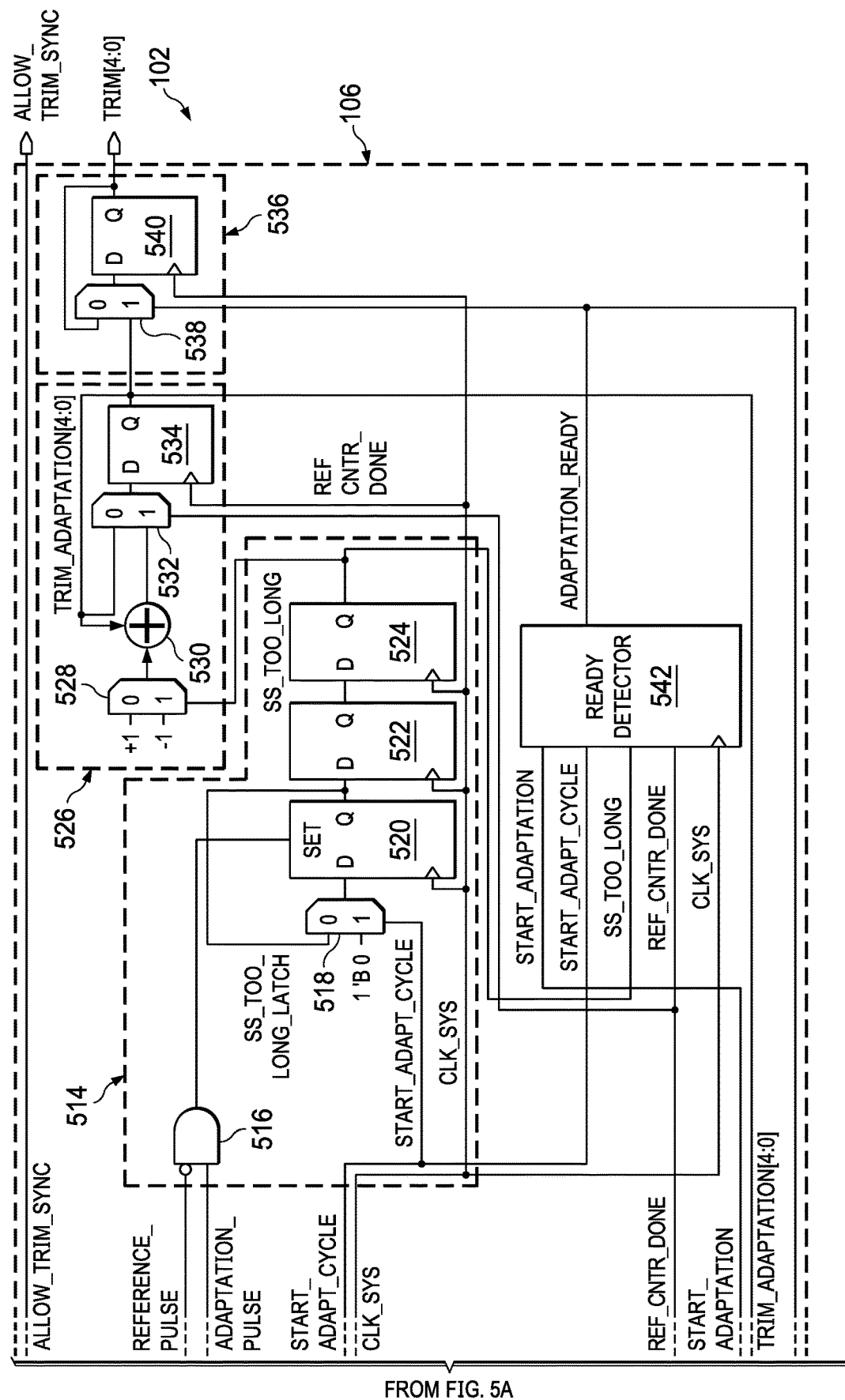

FIGS. 5A and 5B are schematic illustrations showing further detail of an example implementation of the core control circuit 102 of FIG. 1. The example core control circuit 102 of FIG. 1 includes the example single shot trimmer 106 and the example first single shot circuit 108a. The example single shot trimmer 106 includes an example refresh pulse generator 500, an example start detector 502, an example sequencer 504, an example reference pulse generator 506, an example pulse comparator 514, an example counter 526, an example trim dispatcher 536, an example ready detector 542, an example adaptation pulse generator 544, a single shot counter 552, and a logic gate 554.

In the illustrated example of FIGS. 5A and 5B, the example reference pulse generator 506 includes an example logic gate 508, an example logic circuit 510, and an example logic circuit 512. The example pulse comparator 514 includes an example logic gate 516, and example logic circuit 518, an example logic circuit 520, an example logic circuit 522, and an example logic circuit 524. The example counter 526 includes an example logic circuit 528, an example adder 530, an example logic circuit 532, and an example logic circuit 534. The example trim dispatcher 536 includes an example logic circuit 538 and an example logic circuit 540. The example adaptation pulse generator 544 includes an example logic gate 546, an example logic circuit 548, and an example logic circuit 550.

In the illustrated example of FIGS. 5A and 5B, the example refresh pulse generator 500 is coupled to the example start detector 502. In the illustrated example, the example start detector 502 is coupled to the example refresh pulse generator 500, the example sequencer 504, the example oscillator 104, and the example ready detector 542. In the example, the example sequencer 504 is coupled to the example start detector 502, the example reference pulse generator 506, the example pulse comparator 514, the example counter 526, the example ready detector 542, and one or more single shot circuits. In the example, the example reference pulse generator 506 is coupled to the example sequencer 504, the example pulse comparator 514, the example single shot counter 552, the example logic gate 554, and the example oscillator 104. In the example, the example pulse comparator 514 is coupled to the example sequencer 504, the example reference pulse generator 506, the example adaptation pulse generator 544, the example counter 526, the example ready detector 542, and the example oscillator 104.

In the illustrated example of FIGS. 5A and 5B, the example counter 526 is coupled to the example pulse comparator 514, the example sequencer 504, the example trim dispatcher 536, and the example oscillator 104. In the illustrated example, the example trim dispatcher 536 is coupled to the example counter 526, the example ready detector 542, the example oscillator 104, and one or more single shot circuits. In the illustrated example, the example ready detector 542 is coupled to the example start detector 502, the example sequencer 504, the example pulse comparator 514, the example trim dispatcher 536, and the example oscillator 104. In the illustrated example, the example adaptation pulse generator 544 is coupled to the example single shot counter 552, the example pulse comparator 514, the example logic gate 554, and the example first single shot circuit 108a. In the illustrated example, the example single shot counter 552 is coupled to the example reference pulse generator 506, the example adaptation pulse generator 544, and the example first single shot circuit 108a. In the illustrated example, the example logic gate 554 is coupled to the example reference pulse generator 506, the example adaptation pulse generator 544, and the example first single shot circuit 108a. In the illustrated example, the example first single shot circuit 108a is coupled to the example logic gate 554, the example single shot counter 552, the example adaptation pulse generator 544, the example counter 526, and an example reference logic high value.

In the illustrated example of FIGS. 5A and 5B, the example refresh pulse generator 500 is an oscillator. For example, the refresh pulse generator 500 is a ring oscillator, a crystal oscillator, an RC oscillator, or any other suitable oscillator for the application. In the example, the example refresh pulse generator 500 generates a pulse at a preset frequency, for example 1 kilohertz (kHz). The pulse generated by the refresh pulse generator 500 is a signal to trigger adaptation of the single shot pulse length to match the predetermined duration.

In the illustrated example of FIGS. 5A and 5B, the example start detector 502 is a device that detects the rising edge on the pulse generated by the example refresh pulse generator 500. When the example start detector 502 detects a rising edge on the example pulse generated by the example refresh pulse generator 500, the example start detector 502 outputs a pulse (e.g., a start adaptation signal) to the example sequencer 504. The example pulse (e.g., the start adaptation signal) causes the example sequencer 504 to start the process of adapting the length of the single shot pulse to the predetermined duration. In the example, the example start detector 502 operates at the frequency of the example oscillator 104.

In the illustrated example of FIGS. 5A and 5B, the example sequencer 504 is a device that counts predefined numbers of clock cycles to control the length of the example reference pulse generated by the example reference pulse generator 506. For example, the example sequencer 504 is a combination of one or more combinational logic circuit and/or one or more sequential logic circuits. In other examples, the example sequencer 504 can be implemented by one or more integrated circuits, logic circuits, microprocessors, GPUs, DSPs, or controllers from any desired family or manufacturer. The sequencer 504 may be a semiconductor based (e.g., silicon based) device. In further examples, the sequencer 504 may be one or more controllers, one or more ASICs, one or more processors executing machine readable instructions, or any combination thereof suitable to the application.

In operation (e.g., during runtime), the example sequencer 504 initiates generation of the reference pulse generated by the example reference pulse generator 506 with an example start_adapt_cycle signal. The length of on time (e.g., a logic high value) for the reference pulse generated by the example reference pulse generator 506 is based on a ref_pulse_done signal. For example, the example sequencer 504 generates a pulse as the start_adapt_cycle signal. In such an example, the reference pulse generated by the example reference pulse generator 506 remains at a logic high value until the example sequencer 504 generates the ref_pulse_done signal. For example, the sequencer 504 generates the ref_pulse_done signal after a predefined number of clock cycles have been detected. Also, in such an example, the example sequencer 504 generates a ref_cntr_done signal to notify the example counter 526 and the example ready detector 542 that the reference pulse has been generated by the example reference pulse generator 506. At the time the ref_cntr_done signal is generated, the example sequencer 504 also regenerates the start_adapt_cycle signal. The example sequencer 504 continues this process until the sequencer 504 detects an adaptation_ready signal generated by the example ready detector 542. In the example, the example sequencer 504 outputs an allow_trim_sync signal to one or more single shot circuits.

In the illustrated example of FIGS. 5A and 5B, the example reference pulse generator 506 is a device that generates the example reference_pulse signal based on the example start_adapt_cycle and ref_pulse_done signals generated by the example sequencer 504. The example reference pulse generator 506 includes the example logic gate 508, the example logic circuit 510, and the example logic circuit 512. The example logic gate 508 is coupled to the example sequencer 504 and the example logic circuit 510, the example logic circuit 510 is coupled to the example logic circuit 512 and the example logic gate 508. The example logic circuit 512 is coupled to the example logic circuit 510, the example oscillator 104, and the example pulse comparator 514 (e.g., coupled to the pulse comparator 514). In the illustrate example of FIGS. 5A and 5B, the example logic gate 508 is an example OR gate. In the example, the example logic circuit 510 is a 2 to 1 multiplexer. In the example the logic circuit 512 is an example D flip-flop.

In operation (e.g., during runtime), the example logic gate 508 receives the example start_adapt_cycle signal and the example ref_pulse_done signal. The example logic gate 508 computes a logic OR of the start_adapt_cycle signal and the ref_pulse_done signal. The example logic circuit 510 receives the start_adapt_cycle signal and the output of the example logic circuit 512. Based on the output of the example logic gate 508, the example logic circuit 512 outputs either the start_adapt_cycle signal or the output of the example logic circuit 512 to the input of the example logic circuit 512. The example logic circuit 512 outputs the signal received from the output of the example logic circuit 510. The output of the example logic circuit 512 is updated based on the CLK_SYS signal.

In the illustrated example of FIGS. 5A and 5B, the example pulse comparator 514 is a device that compares the reference_pulse signal and an adaptation_pulse signal and adjusts the counter 526. For example, the example pulse comparator 514 includes the example logic gate 516, the example logic circuit 518, the example logic circuit 520, the example logic circuit 522, and the example logic circuit 524. The example logic gate 516 is coupled to the example logic circuit 512, the example adaptation pulse generator 544, and the example logic circuit 520. The example logic circuit 518 is coupled to the example logic circuit 520, the example sequencer 504, and a reference logic low value. The example logic circuit 520 is coupled to the example logic gate 516, the example logic circuit 518, the example logic circuit 522, and the oscillator 104. The example logic circuit 522 is coupled to the example logic circuit 520, the example logic circuit 524, and the example oscillator 104. The example logic circuit 524 is coupled to the example logic circuit 522, the example counter 526, the example ready detector 542, and the example oscillator 104. In the example, the example logic gate 516 is an AND logic gate with one of the terminals inverted. In the example, the example logic circuit 518 is a 2 to 1 multiplexer. In the example, the example logic circuit 520 is a D flip-flop including a set input. In the example, the example logic circuit 522 is a D flip-flop and the example logic circuit 524 is a D flip-flop.

In operation (e.g., during runtime), the example logic gate 516 receives the example reference_pulse signal from the example logic circuit 512 and the example adaptation_pulse signal from the example adaptation pulse generator 544. When the reference_pulse signal is at a logic low value and the adaptation_pulse signal is a logic high value, the example logic gate 516 outputs a logic high value. Otherwise, the example logic gate 516 outputs a logic low value. In operation (e.g., during runtime), the example logic circuit 518 receives a reference logic low value and the output of the example logic circuit 520. The example logic circuit 518 outputs either the reference logic low value or the output of the example logic circuit 520 based on the logic value of the start_adapt_cycle signal. When the start_adapt_cycle signal is a logic high value, the example logic circuit 518 outputs the reference logic low value. When the example start_adapt_cycle signal is a logic low value, the example logic circuit 518 outputs the output of the example logic circuit 520.

In operation (e.g., during runtime), the example logic circuit 520 receives the output of the example logic gate 516, the output of the example logic circuit 518, and the CLK_SYS signal. The output of the example logic circuit 520 is based on the input from the example logic circuit 518 and input from the example logic gate 516. The output of the example logic circuit 520 is updated at the frequency of the CLK_SYS signal. More specifically, at each rising edge of the CLK_SYS signal, the logic circuit 520 is updated based on the logic value at the output of logic circuit 518 and the logic gate 516. For example, if the output of the logic gate 516 is a logic low value, then the output of the logic circuit 520 is set to the logic value at the output of the logic circuit 518 at each rising edge of the CLK_SYS signal. In such an example, when the output of the logic gate 516 is a logic high value, then the output of the logic circuit 520 is set to a logic high value regardless of the logic value at the output of the logic circuit 518 and the rising and/or falling edge of the CLK_SYS signal. In this manner, the output of the logic circuit 520 is set asynchronously by the logic gate 516.

In operation (e.g., during runtime), the example logic circuit 522 receives the output of the example logic circuit 520. The output of the example logic circuit 522 is based on the input to the example logic circuit 522 and is updated at the frequency of the CLK_SYS signal. In operation (e.g., during runtime), the example logic circuit 524 receives the output of the example logic circuit 522. The output of the example logic circuit 524 (e.g., a ss_too_long signal) is based on the input to the example logic circuit 524 and is updated at the frequency of the CLK_SYS signal.

In the illustrated example of FIGS. 5A and 5B, the example counter 526 includes the example logic circuit 528, the example adder 530, the example logic circuit 532, and the example logic circuit 534. The example logic circuit 528 is coupled to the example logic circuit 524, an example logic value corresponding to a decimal one value, an example logic value corresponding to a decimal negative one, and the example adder 530. The example adder 530 is coupled to the example logic circuit 528, the example logic circuit 532, and the example logic circuit 534. The example logic circuit 532 is coupled to the example adder 530, the example logic circuit 534, and the example sequencer 504. The example logic circuit 534 is coupled to the example logic circuit 532, the example trim dispatcher 536, the example adder 530, the example first single shot circuit 108a, and the example oscillator 104. In the example, the example logic circuit 528 is a 2 to 1 multiplexer, the example adder 530 is a full adder, the example logic circuit 532 is a 2 to 1 multiplexer, and the example logic circuit 534 is a D flip-flop.

In operation (e.g., during runtime), the example logic circuit 528 receives the logic value corresponding to one, the logic value corresponding to negative one, and the ss_too_long signal. The logic circuit 528 outputs the logic value corresponding to one if the example ss_too_long signal is a logic low value. The logic circuit 528 outputs the logic value corresponding to negative one if the example ss_too_long signal is a logic high value. In operation (e.g., during runtime), the example adder 530 adds the output of the example logic circuit 528 to the output of the example logic circuit 534. The example logic circuit 532 receives the output of the example adder 530, the output of the example logic circuit 534, and the ref_cntr_done signal. If the ref_cntr_done is a logic high value, the example logic circuit 532 outputs the output of the example adder 530. If the ref_cntr_done is a logic low value, the example logic circuit 532 the output of the example logic circuit 534. In operation (e.g., during runtime), the example logic circuit 534 receives the output of the example logic circuit 532. The output of the example logic circuit 534 (e.g., a trim_adaptation signal) is based on the input to the example logic circuit 534 and is updated at the frequency of the CLK_SYS signal. In the example, the example trim_adaptation signal is a 5-bit signal.

In the illustrated example of FIGS. 5A and 5B, the example trim dispatcher 536 includes the example logic circuit 538 and the example logic circuit 540. The example logic circuit 538 is coupled to the example logic circuit 534, the example logic circuit 540, and the example ready detector 542. In the example, the example logic circuit 540 is coupled to the example logic circuit 538, the example oscillator 104, and one or more single shot circuits.

In operation (e.g., during runtime), the example logic circuit 538 receives the output of the example logic circuit 534, the output of the example logic circuit 540, and the example ready detector 542 (e.g., the adaptation_ready signal). If the adaptation_ready signal is a logic high value, the example logic circuit 538 outputs the trim_adaptation signal. If the adaptation_ready signal is a logic low value, the example logic circuit 538 outputs the output of the example logic circuit 540. In operation (e.g., during runtime), the example logic circuit 540 receives the output of the example logic circuit 538. The output of the example logic circuit 540 (e.g., a trim signal) is based on the input to the example logic circuit 540 and is updated at the frequency of the CLK_SYS signal. In the example, the example trim signal is a 5-bit signal.

In the illustrated example of FIGS. 5A and 5B, the example ready detector 542 is a device that detects whether the example single shot pulse is properly adapted (e.g., matches a predetermined duration). In the example, the example ready detector 542 is a combination of one or more combinational logic circuits and/or one or more sequential logic circuits. In other examples, the ready detector 542 can be implemented by one or more integrated circuits, logic circuits, microprocessors, GPUs, DSPs, or controllers from any desired family or manufacturer. The ready detector 542 may be a semiconductor based (e.g., silicon based) device. In further examples, the ready detector 542 may be one or more controllers, one or more ASICs, one or more processors executing machine readable instructions, or any combination thereof suitable to the application.

In operation (e.g., during runtime), the example ready detector 542 receives the start adaptation signal, indicating that the ready detector 542 is to monitor the length of the single shot pulse. The example ready detector 542 also receives the start_adapt_cycle signal indicating that the reference pulse generator 506 is generating the reference_pulse signal. The example ready detector 542 also receives the ss_too_long signal indicating whether the pulse comparator 514 has indicated that the reference_pulse signal is longer than the adaptation_pulse signal. The example ready detector 542 receives the ref_cntr_done signal indicating that the reference_pulse signal has been generated by the example reference pulse generator 506. The example ready detector 542 operates at the frequency of the CLK_SYS signal.

In operation (e.g., during runtime), the example ready detector 542 monitors the example ss_too_long signal for a trigger event. In the example, the trigger event corresponds to a sequence of alternating logic values on the ss_too_long signal and the next logic high value. For example, the example ready detector 542 determines the logic value on the ss_too_long signal when the ref_cntr_done signal is at a logic high value. When the ready detector 542 detects a logic high value on the ref_cntr_done signal, the logic high value signifies that the ready detector 542 is to monitor the logic value on the ss_too_long signal. If the example ready detector 542 detects a sequence of a logic low value followed by a logic high value, the logic high value followed by a logic low value (e.g., 010) or a sequence of a logic high value followed by a logic low value, the logic low value followed by a logic high value (e.g., 101) the example ready detector 542 monitors the ss_too_long signal for the next logic high value. In the example the trigger event corresponds to an alternating sequence of logic values (e.g., 101, 010) and a logic high value at the next sampling of the ss_too_long signal (e.g., 1011, 0101). For example, the trigger event may correspond to four of the same logic low values, an alternating sequence of logic high and low values (e.g., 0000101). In another example, the trigger event corresponds to six logic high values followed by an alternating sequence of logic low and logic high values (e.g., 1111110101). If the ready detector 542 detects the trigger event, the example ready detector 542 generates the example adaptation_ready signal. The trigger event indicates to the example ready detector 542 that the duration of the adaptation_pulse signal is slightly longer than the reference_pulse signal because the ss_too_long signal is oscillating around too short and too long.

In the illustrated example of FIGS. 5A and 5B, the example adaptation pulse generator 544 is a device that generates the adaptation_pulse signal based on the output of the example single shot counter 552. The example adaptation pulse generator 544 includes the example logic gate 546, the example logic circuit 548, and the example logic circuit 550. In the example, the example logic gate 546 is coupled to the example single shot counter 552 and the example logic circuit 548. The example logic circuit 548 is coupled to the example logic circuit 546 and the example logic circuit 550. The example logic circuit 550 is coupled to the example logic gate 516, the example logic circuit 554, and the example first single shot circuit 108*a*. In the illustrated example of FIGS. 5A and 5B, the example logic gate 546 is an example OR gate. In the example, the example logic circuit 548 is a 2 to 1 multiplexer. In the example the logic circuit 550 is an example D flip-flop.

In operation (e.g., during runtime), the example logic gate 546 receives an example start_adaptation_pulse signal and an example ss_cntr_done signal. The example logic gate 546 computes a logic OR of the start_adaptation_pulse signal and the ss_cntr_done signal. The example logic circuit 548 receives the start_adaptation_pulse signal and the output of the example logic circuit 550. Based on the output of the example logic gate 546, the example logic circuit 550 outputs either the start_adaptation_pulse signal or the output of the example logic circuit 550 to the input of the example logic circuit 550. The example logic circuit 550 outputs the signal received from the output of the example logic circuit 548. The output of the example logic circuit 550 is updated based on a clk_single_shot signal.

In the illustrated example of FIGS. 5A and 5B, the example single shot counter 552 is a combination of one or more combinational logic circuits and/or one or more sequential logic circuits that counts predefined numbers of clock cycles to control the length of the example adaptation_pulse generated by the example adaptation pulse generator 544. For example, the example single shot counter 552 is a combination of one or more combinational logic circuits and/or one or more sequential logic circuits. In other examples, the example single shot counter 552 can be implemented by one or more integrated circuits, logic circuits, microprocessors, GPUs, DSPs, or controllers from any desired family or manufacturer. The single shot counter 552 may be a semiconductor based (e.g., silicon based) device. In further examples, the single shot counter 552 may be one or more controllers, one or more ASICs, one or more processors executing machine readable instructions, or any combination thereof suitable to the application.

In the illustrated example of FIGS. 5A and 5B, the example first single shot circuit 108*a* is a combination of one or more combinational logic circuits and/or one or more sequential logic circuits that generates a single shot pulse based on the reference_pulse signal, the adaptation_pulse signal, and the trim_adaptation signal. In other examples, the example first single shot circuit 108*a* can be implemented by one or more integrated circuits, logic circuits, microprocessors, GPUs, DSPs, or controllers from any desired family or manufacturer. The first single shot circuit 108*a* may be a semiconductor based (e.g., silicon based) device. In further examples, the example first single shot circuit 108*a* may be one or more controllers, one or more ASICs, one or more processors executing machine readable instructions, or any combination thereof suitable to the application.

In operation (e.g., during runtime), the example single shot counter 552 counts the clock cycles generated by the example first single shot circuit 108*a*. When the example single shot counter 552 detects a rising edge on the example reference_pulse signal, the example single shot counter 552 outputs a pulse as the example start_adaptation_pulse signal. The pulse causes the example adaptation pulse generator 544 to start generating the adaptation_pulse signal. The length of on time (e.g., a logic high value) for the adaptation_pulse signal is based on the ss_cntr_done signal. In operation (e.g., during runtime), the example single shot counter 552 generates a pulse as the start_adaptation_pulse signal. In such an example, the adaptation_pulse signal generated by the example adaptation_pulse generator 544 remains at a logic high value until the example single shot counter 552 generates the ss_cntr_done signal. For example, the single shot counter 552 generates the ss_cntr_done signal after a predefined number of clock cycles have been detected from the example first single shot circuit 108*a*.

In operation (e.g., during runtime), the example logic gate 554 receives the example reference_pulse signal and the example adaptation_pulse signal. The example logic gate 554 performs a logic OR on the reference_pulse signal and the adaptation_pulse signal. In this manner, when either of the reference_pulse signal or the adaptation_pulse signal is a logic high value, the example logic gate 554 outputs a logic high value. In operation (e.g., during runtime), the example first single shot circuit 108*a* receives the output of the example logic gate 554, the trim_adaptation signal, and a reference logic high value. The reference logic high value sets the example first single shot circuit 108*a* to a first operational mode. The example first single shot circuit 108*a* generates a clock signal based on the trigger signal and the trim_adaptation signal. The example adaptation pulse generator 544 generates the adaptation_pulse signal based on the start_adaptation_pulse signal and the ss_cntr_done signal generated by the example single shot counter 552.

In the illustrated example of FIGS. 5A and 5B, the example reference pulse generator 506 generates the reference_pulse signal based on the start_adapt_cycle signal and the ref_pulse_done signal generated by the example sequencer 504. The example sequencer 504 counts clock cycles on the example CLK_SYS signal (e.g., generated by the example oscillator 104). When a first predetermined number of clock cycles has been detected, the example sequencer 504 outputs a logic high value on the ref_pulse_done signal. The logic high value on the ref_pulse_done signal causes the example reference pulse generator 506 to transition the reference_pulse from a logic high value to a logic low value. When a second predetermined number of clock cycles has been detected, the example sequencer 504 outputs a logic high value on the ref_cntr_done signal. The logic high value on the ref_cntr_done signal notifies the example counter 526 and the example ready detector 542 that the example reference pulse generator 506 has finished generating the reference_pulse signal for one period. At the time that the logic high value on the ref_cntr_done signal is generated, the example sequencer 504 generates a logic high value on the start_adapt_cycle signal, restarting the generation of the reference_pulse signal by the example reference pulse generator 506.

In the illustrated example of FIGS. 5A and 5B, when the reference_pulse signal is generated, the example first single shot circuit 108*a* is triggered to generate the clk_single_shot signal. In this manner, the example clk_single_shot signal is generated synchronously based on the reference_pulse signal. The example first single shot circuit 108*a* generates the clk_single_shot signal based on the trim_adaptation signal. In response to the reference_pulse signal, the example single shot counter 552 generates a pulse as the start_adaptation_pulse signal, causing the example adaptation pulse generator 544 to generate the adaptation_pulse signal. The example single shot counter 552 counts the clock cycles on the clk_single_shot signal. When a third predetermined number of clock cycles has been detected, the example single shot counter 552 outputs a logic high value on the ss_cntr_done signal. The logic high value on the ss_cntr_done signal causes the example adaptation pulse generator 544 to transition the adaptation_pulse signal from a logic high value to a logic low value.

In the illustrated example of FIGS. 5A and 5B, the example pulse comparator 514 compares the adaptation_pulse (e.g., the adaptation_pulse signal) to the reference_pulse (e.g., the reference_pulse signal). For example, the pulse comparator 514 sets the logic value of the ss_too_long signal which adjusts the input signal to the counter 526. The adjustment on the input signal of the counter 526 does not change the output of the counter 526 until the ref_cntr_done signal reaches a logic high value. When the example pulse comparator 514 detects a falling edge on the reference_pulse signal and a logic high value on the adaptation_pulse signal, the example pulse comparator 514 adjusts the count value of the counter 526 which is output to the trim dispatcher 536. The example pulse comparator 514 adjusts the count value of the example counter 526 by setting the ss_too_long signal to a logic high value. The logic high value on the ss_too_long signal causes the counter 526 to decrement the count value by a logic value corresponding to negative one.

Otherwise, if the adaptation_pulse signal is a logic low value at the falling edge of the reference_pulse signal, the example pulse comparator 514 adjusts the count value of the example counter 526 by keeping the ss_too_long signal at a logic low value. Moreover, the output of the example pulse comparator 514 is updated after three rising edges on the clk_sys signal have passed so the counter 526 changes three cycles of the clk_sys signal after a rising edge on the start_adapt_cycle signal. The logic low value on the ss_too_long signal causes the counter 526 to increment the count value by a logic value corresponding to one. In this manner, the example pulse comparator 514 adjusts the count value of the example counter 526 based on whether a first duration associated with the adaptation_pulse (e.g., the adaptation_pulse signal) exceeds a second duration associated with the reference_pulse (e.g., the reference_pulse signal). In order to accurately adjust the count value of the counter 526, the output of the pulse comparator 514 (e.g., the ss_too_long signal) is reset to a logic low value at each rising edge of the start_adapt_cycle signal. For example, the logic circuit 520, the logic circuit 522, and the logic circuit 524 are set to logic low values at the rising edge of the clk_sys signal when there is a rising edge on the start_adapt_cycle signal.

In the illustrated example of FIGS. 5A and 5B, when the example counter 526 is adjusted by the example pulse comparator 514, the value of the trim_adaptation signal is adjusted as well. In this manner, the duration of the adaptation_pulse signal is properly adapted to the application. The ready detector 542 monitors the ss_too_long signal and determines whether a trigger event has occurred. For example, the example ready detector 542 monitors the ss_too_long signal and the ref_cntr_done signal. In such an example, when the ready detector 542 detects a high logic value on the ref_cntr_done signal, the ready detector 542 detects the logic value on the ss_too_long signal. The example ready detector 542 monitors the ss_too_long signal for a trigger event. For example, the example ready detector 542 monitors the ss_too_long signal for a sequence of a logic low value followed by a logic high value, the logic high value followed by a logic low value, or a sequence of a logic high value followed by a logic low value, the logic low value followed by a logic high value. After detecting such a sequence, the example ready detector 542 monitors the ss_too_long signal for a logic high value at the next sampling of the ss_too_long signal. When the example ready detector 542 detects a logic high value after an alternating sequence of logic values, the example ready detector 542 detects the trigger event. In response to a trigger event, the ready detector 542 sets the adaptation_ready signal to a logic high value, causing the trim dispatcher 536 to transmit the trim signal to one or more single shot circuits operating in a second operational mode. The example sequencer 504 also transmits the allow_trim_sync signal to the one or more single shot circuits operating in a second operational mode. The one or more single shot circuits are to generate one or more single shot pulses based on the allow_trim_sync signal.

Figure 6:
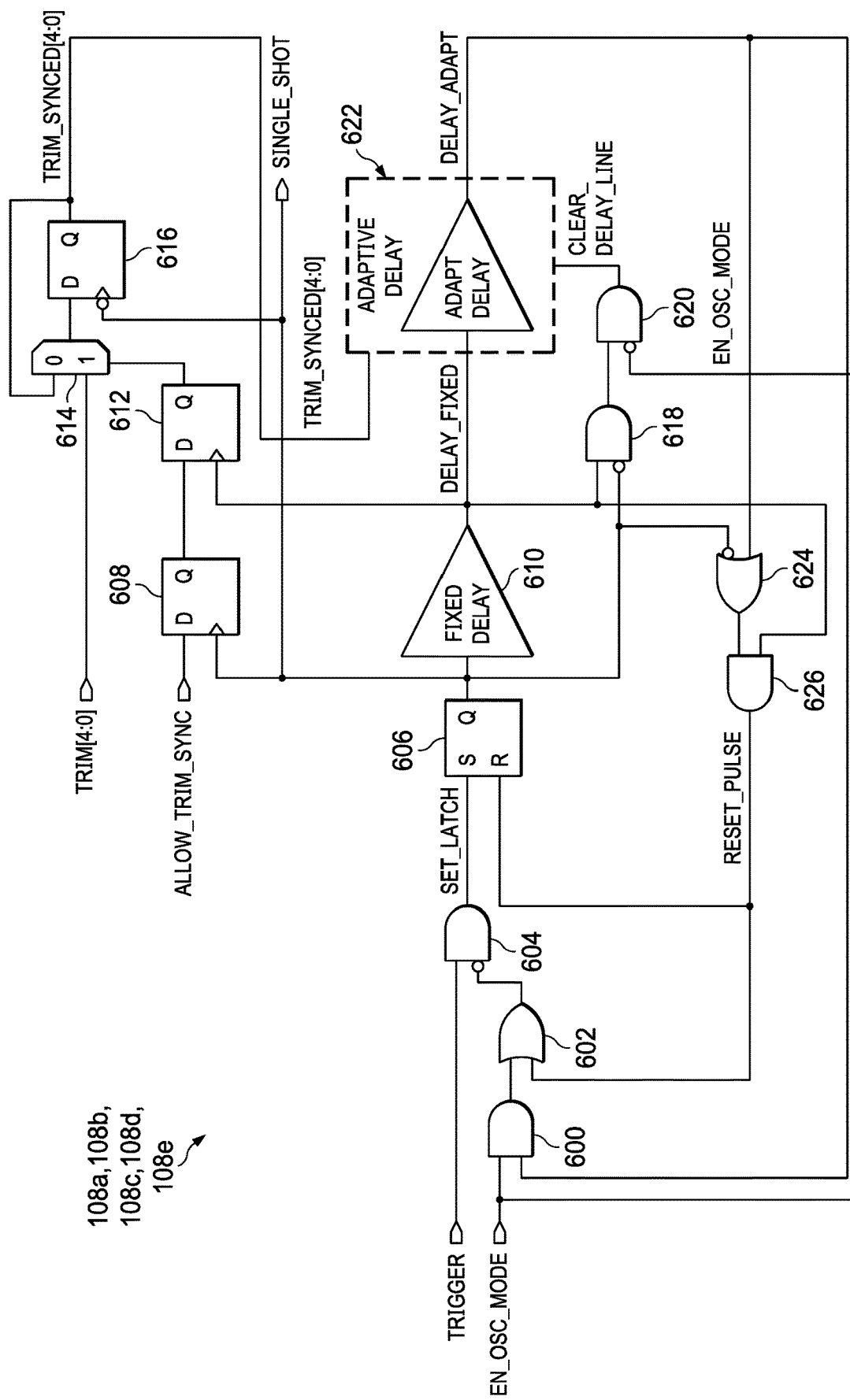
FIG. 6 is a schematic illustration showing further detail of an example implementation of one of the single shot circuits of FIGS. 1 and 5.

FIG. 6 is a schematic illustration showing further detail of an example implementation of one of the single shot circuits 108a, 108b, 108c, 108d, 108e of FIG. 1. The example one of the example single shot circuits 108a, 108b, 108c, 108d, 108e includes an example logic gate 600, an example logic gate 602, an example logic gate 604, an example logic circuit 606, an example logic circuit 608, an example delay circuit 610, an example logic circuit 612, an example logic circuit 614, an example logic circuit 616, an example logic gate 618, an example logic gate 620, an example adaptive delay circuit 622, an example logic gate 624, and an example logic gate 626. In the example, the logic gate 600 is coupled to an example en_osc_mode signal input, the adaptive delay circuit 622, and the logic gate 602. The example logic gate 602 is coupled to the logic gate 604, the logic gate 600, and the logic gate 626. The example logic gate 604 is coupled to the example logic gate 602, the example logic circuit 606, and an example trigger signal input. The example logic circuit 606 is coupled to the logic gate 604, the logic gate 626, the logic circuit 608, the delay circuit 610, the logic gate 618, the logic gate 624, the logic circuit 616, and an example single_shot signal output. The example logic circuit 608 is coupled to the example logic circuit 606, the example logic circuit 612, and an example allow_trim_sync signal input. In some examples disclosed herein, a delay circuit and/or delay circuits may be referred to as a delay cell and/or delay cells, respectively.

In the illustrated example of FIG. 6, the example delay circuit 610 is coupled to the example logic circuit 606, the logic circuit 612, the adaptive delay circuit 622, the logic gate 618, and the logic gate 626. The example logic circuit 612 is coupled to the delay circuit 610, the logic circuit 608, and the logic circuit 614. The example logic circuit 614 is coupled to the logic circuit 612, the logic circuit 616, and an example trim signal input. The example logic circuit 616 is coupled to the logic circuit 606, the logic circuit 614, and the adaptive delay circuit 622. The example logic gate 618 is coupled to the delay circuit 610, the logic circuit 606, and the logic gate 620. The example logic gate 620 is coupled to the logic gate 618, the adaptive delay circuit 622, and the en_osc_mode signal input. The example adaptive delay circuit 622 is coupled to the logic circuit 616, the delay circuit 610, the logic gate 620, and the logic gate 600. The example logic gate 624 is coupled to the logic circuit 606, the adaptive delay circuit 622, and the logic gate 626. The example logic gate 626 is coupled to the delay circuit 610, the logic gate 624, the logic gate 602, and the logic circuit 606.

In the illustrated example of FIG. 6, the example logic gate 600 is an AND gate. In the example, the logic gate 600 receives the en_osc_mode signal and the output of the adaptive delay circuit 622 (e.g., a delay_adapt signal) and performs a logic AND on the signals. In this manner, the logic gate 600 outputs a logic high value when both the en_osc_mode signal and the delay_adapt signal are logic high values.

In the illustrated example of FIG. 6, the example logic gate 602 is an OR gate. In the example, the logic gate 602 receives the output of the logic gate 600 and the output of the logic gate 626 (e.g., a reset_pulse signal) and performs a logic OR on the signals. In this manner, the logic gate 602 outputs a logic high value when either the output of the logic gate 600 or the reset_pulse signal are logic high values.

In the illustrated example of FIG. 6, the example logic gate 604 is an AND gate with one terminal inverted. In the example, the logic gate 604 receives the output of the logic gate 602 and the trigger signal. In this manner, the logic gate 604 outputs a logic high value when the trigger signal is a logic high value and the output of the logic gate 602 is a logic low value.

In the illustrated example of FIG. 6, the example logic circuit 606 is an SR latch. In the example, the logic circuit 606 receives the output of the logic gate 604 (e.g., a set_latch signal) and the reset_pulse signal. In this manner, the output of the logic circuit 606 is set to a logic high value by the logic value that is at the output of the logic gate 604. Moreover, the output of the logic circuit 606 is set to a logic low value when the reset input (e.g., the reset_pulse signal) is a logic high. For example, the logic circuit 606 will remain at the logic value set by the logic gate 604 until a logic high value is received from the logic gate 626.

In the illustrated example of FIG. 6, the example logic circuit 608 is a D flip-flop. In the example, the logic circuit 608 receives the allow_trim_sync signal and the output of the logic circuit 606. In this manner, the output of the logic circuit 608 is set by the allow_trim_sync signal at the rising edge of the signal at the output of the logic circuit 606. The output of the logic circuit 608 is updated with the logic value on the allow_trim_sync signal at the frequency of the signal output from the logic circuit 606.

In the illustrated example of FIG. 6, the example delay circuit 610 is a circuit that receives an input and after a predetermined amount of time (e.g., 10 nanoseconds (ns)) outputs the signal input to the circuit (e.g., a delay_fixed signal). In this manner, the delay circuit 610 receives the output of the logic circuit 606 and after a predetermined amount of time, the delay circuit 610 outputs the input received from the logic circuit 606 to one or more circuits or components.

In the illustrated example of FIG. 6, the example logic circuit 612 is a D flip-flop. In the example, the logic circuit 612 receives the output of the logic circuit 608 and the output of the delay circuit 610. In this manner, the output of the logic circuit 612 is set by the output of the logic circuit 608 at the rising edge of the signal at the output of the delay circuit 610. The output of the logic circuit 612 is updated with the logic value at the output of the logic circuit 608 at the frequency of the signal output from the delay circuit 612.

In the illustrated example of FIG. 6, the example logic circuit 614 is a 2 to 1 multiplexer that receives two 5-bit signals (e.g., the trim signal and a trim_synced signal) and outputs one of the two 5-bit signals based on a 1-bit input signal (e.g., the output of the logic circuit 612). The logic circuit 614 receives the trim signal, the output of the logic circuit 616 (e.g., the trim_synced signal), and the output of the logic circuit 612. When the output of the logic circuit 612 is a logic high value, the logic circuit 614 outputs the trim signal. When the output of the logic circuit 612 is a logic low value, the logic circuit 614 outputs a logic value that is the same as the logic value at the output of the logic circuit 616. In the example, the trim_synced signal is a 5-bit signal.

In the illustrated example of FIG. 6, the example logic circuit 616 is a five bit register including five D flip-flops, each with an inverted clock terminal. The logic circuit 616 receives a 5-bit signal (e.g., the output of the logic circuit 614) and outputs the 5-bit signal (e.g., the trim_synced signal) at the frequency of the inverter clock terminal (e.g., the output of the logic circuit 606, the single_shot signal). In this manner, the output of the logic circuit 614 sets the logic value at the output of the logic circuit 616 at the falling edge of the signal at the output of the logic circuit 606. The output of the logic circuit 616 is updated with the logic value at the output of the logic circuit 614 at the frequency of the signal output from the logic circuit 606 (e.g., the single_shot signal).

In the illustrated example of FIG. 6, the example logic gate 618 is an AND gate with one terminal inverted. The logic gate 618 receives the delay_fixed signal and the output of the logic circuit 606. In this manner, the logic gate 618 outputs a logic high value when the delay_fixed signal is a logic high value and the output of the logic circuit 606 is a logic low value.

In the illustrated example of FIG. 6, the example logic gate 620 is an AND gate with one terminal inverted. In the example, the logic gate 620 receives the output of the logic gate 618 and the en_osc_mode signal. In this manner, the logic gate 620 outputs a logic high value as a clear_delay_line signal when the output of the logic gate 618 is a logic high value and the en_osc_mode signal is a logic low value.

In the illustrated example of FIG. 6, the example adaptive delay circuit 622 is a circuit that can be controlled to adjust the amount of time between the time the adaptive delay circuit 622 receives a signal (e.g., the delay_fixed signal) and outputs the signal (e.g., the delay_adapt signal). In the example, the adaptive delay circuit 622 (e.g., an adaptive delay element) receives the delay_fixed signal, the trim synced signal, and the clear_delay_line signal and outputs the delay_adapt signal. In this manner, the trim_synced signal sets the amount of time to delay the output of the delay_fixed signal and the clear_delay_line sets the delay between the delay_fixed signal and the delay_adapt signal to zero seconds.

In the illustrated example of FIG. 6, the example logic gate 624 is an OR gate with one terminal inverted. In the example, the logic gate 624 receives the output of the logic circuit 606 and the delay_adapt signal. In this manner, the logic gate 624 outputs a logic high value when either the output of the logic circuit 606 is a logic low value or the delay_adapt signal is a logic high value.

In the illustrated example of FIG. 6, the example logic gate 626 is an AND gate. In the example, the logic gate 626 receives the output of the logic gate 624 and the delay_fixed signal. In this manner, the logic gate 626 outputs a logic high value as the reset_pulse signal when the output of the logic gate 624 is a logic high value and the delay_fixed signal is a logic high value.

In the illustrated example of FIG. 6, the example one of the example single shot circuits 108a, 108b, 108c, 108d, 108e includes two operational modes. In the first operational mode (e.g., en_osc_mode signal is a logic low value), the example one of the example single shot circuits 108a, 108b, 108c, 108d, 108e operates as a single shot circuit and outputs a single_shot pulse as the single_shot signal. In the first operational mode, in response to a pulse on the trigger signal, the example one of the example single shot circuits 108a, 108b, 108c, 108d, 108e outputs a single_shot pulse as the single_shot signal and the duration of the single_shot pulse is set by the trim signal. In the first operational mode, the output of the example one of the example single shot circuits 108a, 108b, 108c, 108d, 108e is a pulse with a duty ratio that is variable based on the trim signal.

In the illustrated example of FIG. 6, when the example one of the example single shot circuits 108a, 108b, 108c, 108d, 108e is in the second operational mode (e.g., en_osc_mode signal is a logic high value), the example one of the example single shot circuits 108a, 108b, 108c, 108d, 108e operates as an oscillator. In the example second operational mode, in response to a pulse as the trigger signal, the example one of the example single shot circuits 108a, 108b, 108c, 108d, 108e outputs an oscillating signal at a defined frequency, the defined frequency adjustable based on the trim signal. In the example second operational mode, the output of the example one of the example single shot circuits 108a, 108b, 108c, 108d, 108e is a pulse with a duty ratio of fifty percent oscillating at a defined frequency. In the example second operational mode, the example one of the example single shot circuits 108a, 108b, 108c, 108d, 108e generates a clock signal.

Figure 7:
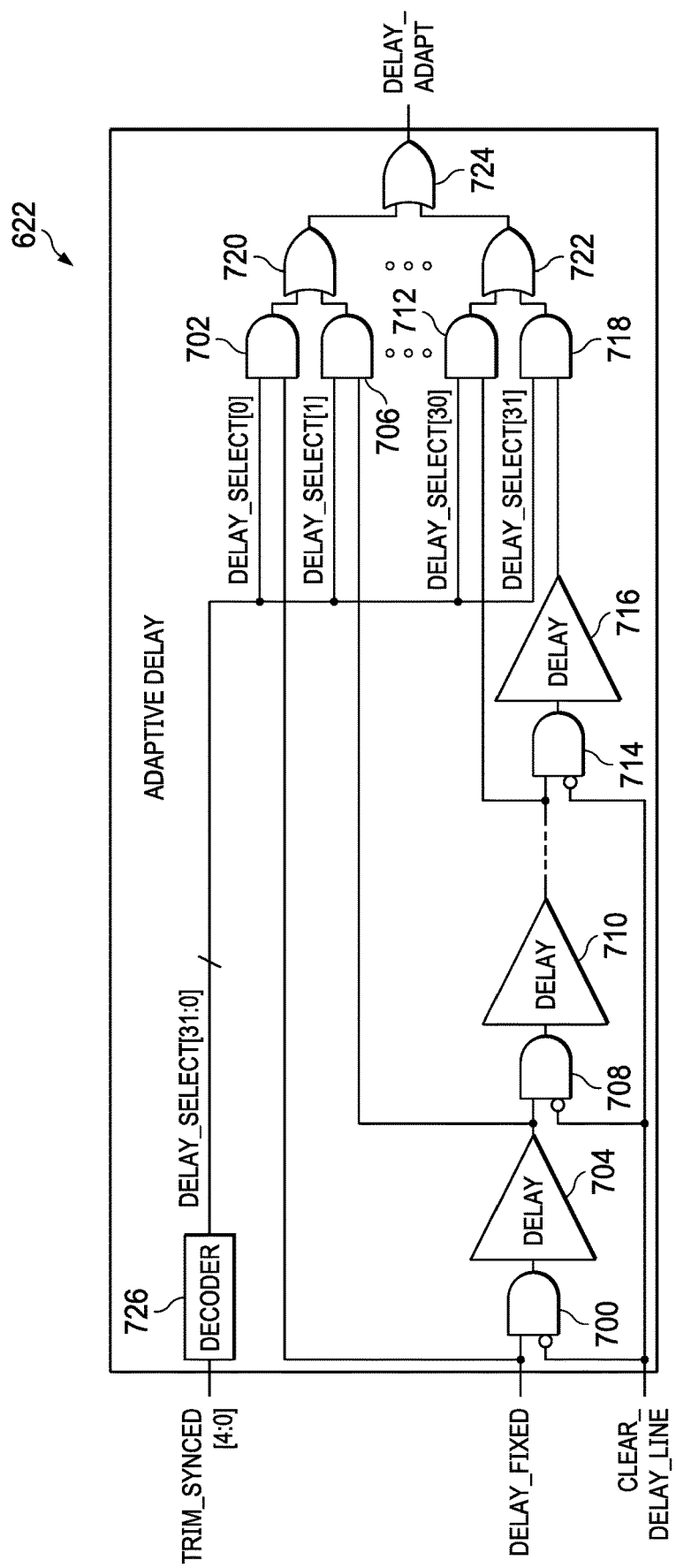
FIG. 7 is a schematic illustration showing further detail of an example implementation of the adaptive delay circuit of FIG. 6.

FIG. 7 is a schematic illustration showing further detail of an example implementation of the adaptive delay circuit 622 of FIG. 6. The example adaptive delay circuit 622 includes an example logic gate 700, an example logic gate 702, an example delay circuit 704, an example logic gate 706, an example logic gate 708, and example delay circuit 710, an example logic gate 712, an example logic gate 714, an example delay circuit 716, an example logic gate 718, an example logic gate 720, an example logic gate 722, an example logic gate 724, and an example decoder 726.

In the illustrated example of FIG. 7, the logic gate 700 is coupled to the delay_fixed signal input, the clear_delay_line signal input, and the delay circuit 704. In the example, the logic gate 702 is coupled to the delay_fixed signal input, the decoder 726, and the logic gate 720. In the example, the delay circuit 704 is coupled to the logic gate 700, the logic gate 708, and the logic gate 706. In the example, the logic gate 706 is coupled to the delay circuit 704, the decoder 726, and the logic gate 720. In the example, the logic gate 708 is coupled to the delay circuit 704, the clear_delay_line signal input, the delay circuit 710, and the logic gate 706. In the example, the delay circuit 710 is coupled to the logic gate 708, the logic gate 714, and the logic gate 712. In the example, the logic gate 712 is coupled to the logic gate 722, the delay circuit 710, and the decoder 726.

In the illustrated example of FIG. 7, the logic gate 714 is coupled to the delay circuit 710 and the delay circuit 716. In the example, the delay circuit 716 is coupled to the logic gate 714 and the logic gate 718. In the example, the logic gate 718 is coupled to the delay circuit 716, the logic gate 722, and the decoder 726. In the example, the logic gate 720 is coupled to the logic gate 702, the logic gate 706, and the logic gate 724. In the example, the logic gate 722 is coupled to the logic gate 712, the logic gate 718, and the logic gate 724. In the example, the logic gate 724 is coupled to the logic gate 720, the logic gate 722, and the delay_adapt signal output.

In the illustrated example of FIG. 7, each of the example logic gates 700, 708, 714 are AND gates with one inverted terminal. In the example, the logic gate 700 receives the delay_fixed signal and the clear_delay_line signal. In this manner, when the delay_fixed signal is a logic high value and the clear_delay_line signal is a logic low value the logic gate 700 outputs a logic high value. In the example, the logic gate 708 receives the output of the delay circuit 704 and the clear_delay_line signal. In this manner, when the output of the delay circuit 704 is a logic high value and the clear_delay_line signal is a logic low value, the logic gate 708 outputs a logic high value. In the example, the logic gate 714 receives the output of the delay circuit 710 and the clear_delay_line signal. In this manner, when the output of the delay circuit 710 is a logic high value and the clear_delay_line signal is a logic low value, the logic gate 714 outputs a logic high value.

In the illustrated example of FIG. 7, each of the delay circuits 704, 710, 716 is a circuit that receives an input and after a predetermined amount of time (e.g., 1 ns) outputs the signal input to a circuit. In the example, the delay circuit 704 receives the output of the logic gate 700. In this manner, after a predetermined amount of time, the delay circuit 704 outputs the input received from the logic gate 700 to the logic gate 708. In the example, the delay circuit 710 receives the output of the logic gate 708. In this manner, after a predetermined amount of time, the delay circuit 710 outputs the input received from the logic gate 708 to the logic gate 714. In the example, the delay circuit 716 receives the output of the logic gate 714. In this manner, after a predetermined amount of time, the delay circuit 716 outputs the input received from the logic gate 714 to the logic gate 718.

In the illustrated example of FIG. 7, each of the logic gates 702, 706, 712, 718 are AND gates. In the example, the logic gate 702 receives the delay_fixed signal and a delay_select[0] signal from the decoder 726. In this manner, the logic gate 702 outputs a logic high value if the delay_fixed signal is a logic high value and the delay_select[0] signal is a logic high value. In the example, the logic gate 706 receives the output of the delay circuit 704 and a delay_select[1] signal. In this manner, the logic gate 706 outputs a logic high value if the output of the delay circuit 704 is a logic high value and the delay_select[1] signal is a logic high value. In the example, the logic gate 712 receives the output of the delay circuit 710 and a delay_select[30] signal. In this manner, the logic gate 712 outputs a logic high value if the output of the delay circuit 710 is a logic high value and the delay_select[30] signal is a logic high value. In the example, the logic gate 718 receives the output of the delay circuit 716 and a delay_select[31] signal. In this manner, the logic gate 718 outputs a logic high value if the output of the delay circuit 716 is a logic high value and the delay_select[31] signal is a logic high value.

In the illustrated example of FIG. 7, each of the logic gates 720, 722, 724 is an OR gate. In the example, the logic gate 720 receives the output of the logic gate 702 and the output of the logic gate 706. In this manner, the logic gate 720 outputs a logic high value if either the output of the logic gate 702 is a logic high value or the output of the logic gate 706 is a logic high value. In the example, the logic gate 722 receives the output of the logic gate 712 and the output of the logic gate 718. In this manner, the logic gate 722 outputs a logic high value if either the output of the logic gate 712 is a logic high value or the output of the logic gate 718 is a logic high value. In the example, the logic gate 724 receives the output of the logic gate 720 and the output of the logic gate 722. In this manner, the logic gate 724 outputs a logic high value as the delay_adapt signal if either the output of the logic gate 720 is a logic high value or the output of the logic gate 722 is a logic high value.

In the illustrated example of FIG. 7, the example decoder 726 is a combination of one or more combinational logic circuits and/or one or more sequential logic circuits that converts an input signal including n bits (e.g., the trim_synced signal including 5-bits) to an output signal including $2^n$ bits (e.g., a delay_select[31:0] including 32-bits). In the example, the example decoder 726 is a one hot decoder. In the example, the example decoder 726 decodes the binary value corresponding to the input signal (e.g., a binary value of 00010 on the trim_synced signal) to a binary value with only one logic high value, the logic high value in a position in the binary value corresponding to the decimal equivalent of the input binary number (e.g., a binary value of 00000000000000000000000000000100 on the delay_select[31:0] signal). For example, if the trim_synced signal includes a binary value corresponding to 5, the delay_select[31:0] signal will include all logic low values except for the bit 5 places away from the least significant bit. In other examples, the example decoder 726 is a 1-of-n decoder, a code translator decoder, and address decoder, or any other suitable decoder for the application. In the examples, the decoder 726 selects one or more delay cells based on the trim_synced signal.

In the illustrated example of FIG. 7, the example trim_synced signal selects the duration of the delay for the adaptive delay circuit 622. In the example, the delay_fixed signal is input into the logic gate 700 and delayed by a number of delay circuits (e.g., delay circuits 704, 710, 716) corresponding to the decimal equivalent of the trim_synced signal. For example, a binary value of 00001 on the trim_synced signal corresponds to a selection of only the delay circuit 704. In such an example, the delay_select[1] signal is a logic high value, and the output of the delay circuit 704 is a logic high value. The logic high value on the delay_select[1] signal and the logic high value on the output of the delay circuit 704 cause the logic gate 706 to output a logic high value. The logic high value on the output of the logic gate 706 causes the logic gate 720 to output a logic high value and the logic high value on the output of the logic gate 720 causes the logic gate 724 to output a logic high value as the delay_adapt signal. The trim_synced signal allows the duration of the delay of the adaptive delay circuit 622 to be adaptively changed during operation of the circuit.

In the illustrated example of FIG. 7, only three delay circuits (e.g., delay circuits 704, 710, 716) are shown. However, the adaptive delay circuit 622 includes 31 delay circuits with respective logic gates to allow selection of each delay circuit.

Figure 8:
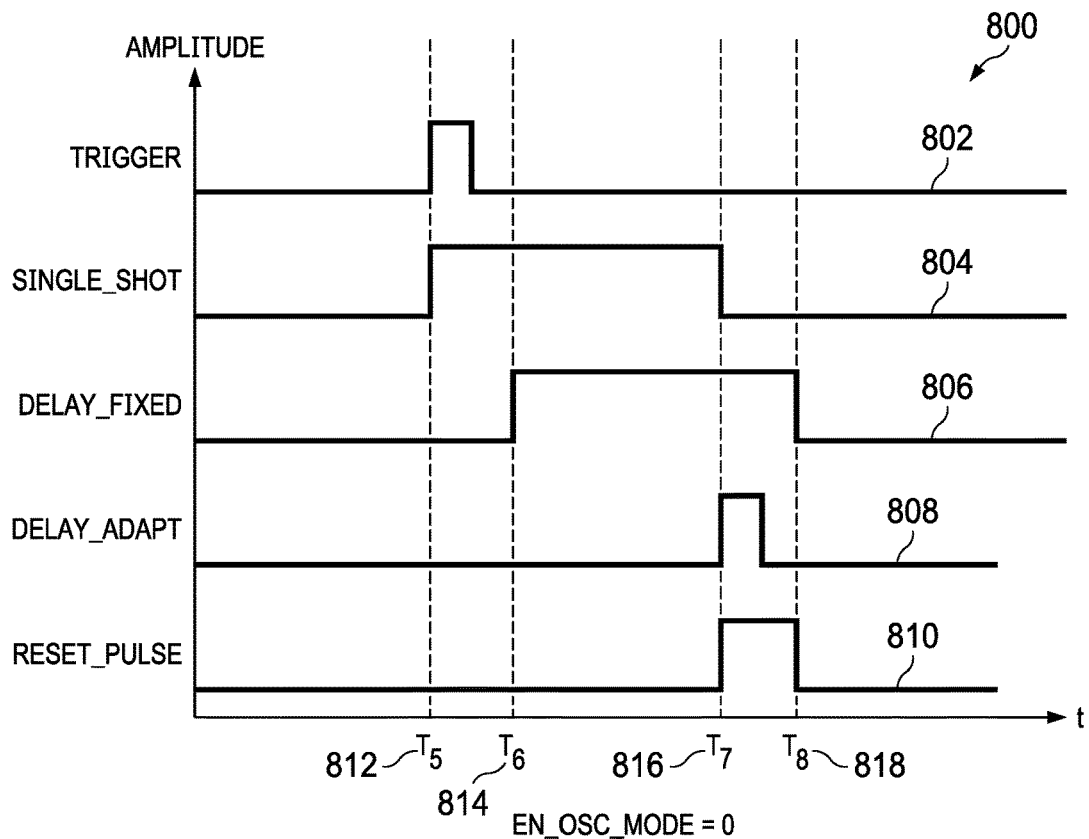
FIG. 8 is a timing diagram illustrating various example signals associated with a first operational mode of the one of the single shot circuit of FIG. 6 to generate a single shot pulse.

FIG. 8 is a timing diagram 800 illustrating various example signals associated with a first operational mode of the one of the single_shot circuits 108a, 108b, 108c, 108d, 108e of FIG. 6 to generate a single_shot pulse. The example timing diagram 800 includes an example seventh curve 802, an example eighth curve 804, an example ninth curve 806, an example tenth curve 808, an example eleventh curve 810, an example sixth time 812 ($T_5$), an example seventh time 814 ($T_6$), an example eighth time 816 ($T_7$), and an example ninth time 818 ($T_8$). The example timing diagram 800 includes an amplitude axis and a time axis.

In the illustrated example of FIG. 8, the example seventh curve 802 represents the trigger signal received by the example logic gate 604 of FIG. 6. The example eighth curve 804 represents the single_shot signal generated by the logic circuit 606 of FIG. 6. The example ninth curve 806 represents the example delay_fixed signal generated by the delay circuit 610 of FIG. 6. The example tenth curve 808 represents the delay_adapt signal generated by the adaptive delay circuit 622. The example eleventh curve 810 represents the reset_pulse signal generated by the example logic gate 626 of FIG. 6.

In the illustrated example of FIG. 8, the one of the example single shot circuits 108a, 108b, 108c, 108d, 108e of FIG. 6 is in a first operational mode. In this manner, the value of the en_osc_mode signal received by the logic circuit 606 is at a logic low value (e.g., en_osc_mode=0). For example, the example second single shot circuit 108b, the example third single shot circuit 108c, the example fourth single shot circuit 108d, and the example fifth single shot circuit 108e of FIG. 1 operate in the first operational mode.

In the illustrated example of FIG. 8, prior to the example sixth time 812, each of the example seventh curve 802, the example eighth curve 804, the example ninth curve 806, the example tenth curve 808, and the example eleventh curve 810 are at a logic low value. At the example sixth time 812, the example seventh curve 802 transitions from a logic low value to a logic high value, the eighth curve 804 transitions from a logic low value to a logic high value, the example ninth curve 806 remains at a logic low value, the example tenth curve 808 remains at a logic low value, and the example eleventh curve 810 remains at a logic low value.

In the illustrated example of FIG. 8, between the sixth time 812 and the seventh time 814, the example seventh curve 802 transitions from a logic high value to a logic low value, the example eighth curve 804 remains at a logic high value, the example ninth curve 806 remains at a logic low value, the example tenth curve 808 remains at a logic low value, and the example eleventh curve 810 remains at a logic low value. In the example, the difference between the seventh time 814 and the sixth time 812 is the time delay associated with the example delay circuit 610 of FIG. 6.

In the illustrated example of FIG. 8, at the seventh time 814 the example seventh curve 802 remains at a logic low value, the example eighth curve 804 remains at a logic high value, the example ninth curve 806 transitions from a logic low value to a logic high value, the example tenth curve 808 remains at a logic low value, and the example eleventh curve 810 remains at a logic low value.

In the illustrated example of FIG. 8, between the seventh time 814 and the eighth time 816, the example seventh curve 802 remains at a logic low value, the example eighth curve 804 remains at a logic high value, the example ninth curve 806 remains at a logic high value, the example tenth curve 808 remains at a logic low value, and the example eleventh curve 810 remains at a logic low value. In the example, the difference between the eighth time 816 and the seventh time 814 is the time delay associated with the example adaptive delay circuit 622 of FIG. 6.

In the illustrated example of FIG. 8, at the example eighth time 816 the example seventh curve 802 remains at a logic low value, the example eighth curve 804 transitions from a logic high value to a logic low value, the example ninth curve 806 remains at a logic high value, the example tenth curve 808 transitions from a logic low value to a logic high value, and the example eleventh curve 810 transitions from a logic low value to a logic high value.

In the illustrated example of FIG. 8, between the ninth time 818 and the eighth time 816, the example seventh curve 802 remains at a logic low value, the example eighth curve 804 remains at a logic low value, the example ninth curve 806 remains at a logic high value, the example tenth curve 808 transitions from a logic high value to a logic low value, and the example eleventh curve 810 remains at a logic high value.

In the illustrated example of FIG. 8, at the ninth time 818 the example seventh curve 802 remains at a logic low value, the example eighth curve 804 remains at a logic low value, the example ninth curve 806 transitions from a logic high value to a logic low value, the example tenth curve 808 remains at a logic low value, and the example eleventh curve 810 transitions from a logic high value to a logic low value.

In the illustrated example of FIG. 8, the example logic high value on the example seventh curve 802 (e.g., the trigger signal) at the sixth time 812 sets the output of the logic circuit 606 to a logic high value. The value of the logic circuit 606 will remain at a logic high value until the reset input (e.g., the reset pulse signal) receives a logic high value. The duration of the adaptive delay circuit 622 sets the duration of the pulse (e.g., the duration of the logic high value) on the example eighth curve 804. More specifically, because the number of delay elements used to generation the duration of the delay circuit 610 is fixed, the duration of the adaptive delay circuit 622 sets the duration of the pulse based on the number of delay circuits (e.g., the delay circuit 704, the delay circuit 710, the delay circuit 716, etc.) selected. In this manner, the difference in time (e.g., the duration) between the eighth time 816 and the sixth time 812 is set by the adaptive delay circuit 622. Moreover, while the duration of the delay elements in both the delay circuit 610 and the adaptive delay circuit 622 varies due to operating conditions, because the adaptive delay circuit 622 is adaptable and the number of delay elements can be selected based on the trim_synced signal, the difference between the eight time 816 and the sixth time 812 is the duration of the delay circuit 612 plus the duration of the adaptive delay circuit 622. When the output of the adaptive delay circuit 622 transitions to a logic high value (e.g., at the eighth time 816), the output of the logic circuit 606 is reset to a logic low value by the output of the logic gate 626 (e.g., the reset_pulse signal). In the illustrated example, the reset of the logic circuit 606 is represented at the eighth time 816 when the eleventh curve 810 transitions to a logic high value.

Figure 9:
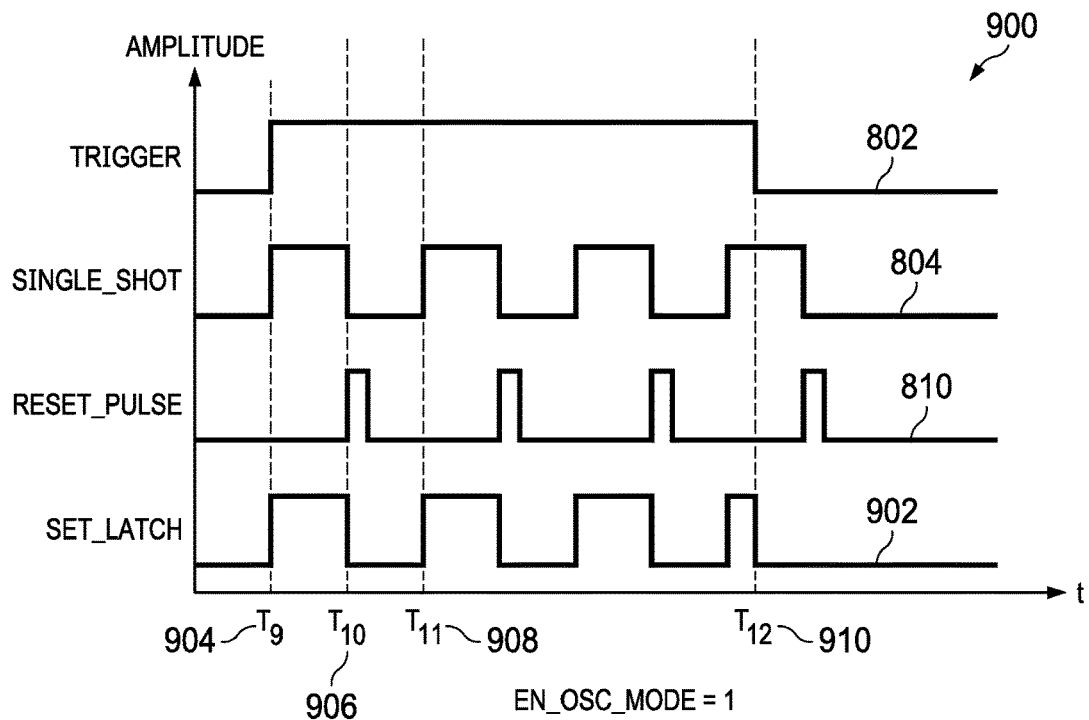
FIG. 9 is a timing diagram illustrating various example signals associated with a second operational mode of the one of the single shot circuit of FIG. 6 to operate as an oscillator.

FIG. 9 is a timing diagram 900 illustrating various example signals associated with a second operational mode of the one of the single_shot circuits 108a, 108b, 108c, 108d, 108e of FIG. 6 to operate as an oscillator. The example timing diagram 900 includes the example seventh curve 802, the example eighth curve 804, the example eleventh curve 810, an example twelfth curve 902, an example tenth time 904 ($T_9$), an example eleventh time 906 ($T_{10}$), an example twelfth time 908 ($T_{11}$), and an example thirteenth time 910 ($T_{12}$). The example timing diagram 900 includes an amplitude axis and a time axis.

In the illustrated example of FIG. 9, the example seventh curve 802 represents trigger signal received by the example logic gate 604 of FIG. 6. The example eighth curve 804 represents the single_shot signal generated by the logic circuit 606 of FIG. 6. The example eleventh curve 810 represents the reset_pulse signal generated by the example logic gate 626 of FIG. 6. The example twelfth curve 902 represents the output of the logic gate 604 of FIG. 6 (e.g., the set_latch signal).

In the illustrated example of FIG. 9, the one of the example single shot circuits 108a, 108b, 108c, 108d, 108e of FIG. 6 is in a second operational mode. In this manner, the value of the en_osc_mode signal received by the logic circuit 606 is at a logic high value (e.g., en_osc_mode=1). For example, the example first single shot circuit 108a of FIG. 1 operate in the second operational mode.

In the illustrated example of FIG. 9, prior to the tenth time 904, each of the example seventh curve 802, the example eighth curve 804, the example eleventh curve 810, and the example twelfth curve 902 are at a logic low value. At the tenth time 904, the example seventh curve 802 transitions from a logic low value to a logic high value, the example eighth curve 804 transitions from a logic low value to a logic high value, the example eleventh curve 810 remains at a logic low value, and the example twelfth curve 902 transitions from a logic low value to a logic high value.

In the illustrated example of FIG. 9, between the tenth time 904 and the eleventh time 906 the example seventh curve 802 remains at a logic high value, the example eighth curve 804 remains at a logic high value, the example eleventh curve 810 remains at a logic low value, and the example twelfth curve 902 remains at a logic high value. The difference between the eleventh time 906 and the tenth time 904 is determined based on the duration of the adaptive delay circuit 622 of FIG. 6. More specifically, because the duration of the delay circuit 610 is fixed, the duration of the adaptive delay circuit 622 sets the duration of the pulse based on the number of delay circuits (e.g., the delay circuit 704, the delay circuit 710, the delay circuit 716, etc.) selected. Therefore the difference between the eleventh time 906 and the tenth time 904 is dependent on the duration of the adaptive delay circuit 622 of FIG. 6.

In the illustrated example of FIG. 9, at the eleventh time 906, the example seventh curve 802 remains at a logic high value, the example eighth curve 804 transitions from a logic high value to a logic low value, the example eleventh curve 810 transitions from a logic low value to a logic high value, and the example twelfth curve 902 transitions from a logic high value to a logic low value. At the eleventh time 906, the adaptive delay circuit 622 of FIG. 6 outputs a logic high value, causing the logic gate 626 of FIG. 6 to output a logic high value (e.g., the reset_pulse signal). The logic high value on the output of the logic gate 626 causes the set_latch signal to transition to a logic low value as well.

In the illustrated example of FIG. 9, between the eleventh time 906 and the twelfth time 908 the example seventh curve 802 remains at a logic high value, the example eighth curve 804 remains at a logic low value, the example eleventh curve 810 remains at a logic high value and then transitions to a logic low value, and the example twelfth curve 902 remains at a logic low value. In the example, the eighth curve 804 and the twelfth curve 902 remain at a logic low value because the output of the adaptive delay circuit 622 is a logic high value (e.g., the delay_adapt signal is a logic high value). In this manner, the output of the logic gate 604 (e.g., the set_latch signal) is maintained at a logic low value causing the output of the logic circuit 606 (e.g., the single_shot signal) to be maintained at a logic low value.

In the illustrated example of FIG. 9, at the twelfth time 908, the example seventh curve 802 remains at a logic high value, the example eighth curve 804 transitions from a logic low value to a logic high value, the example eleventh curve 810 remains at a logic low value, and the example twelfth curve 902 transitions from a logic low value to a logic high value. At the twelfth time 908, the output of the example adaptive delay circuit 622 of FIG. 6 transitions from a logic high value to a logic low value. In this manner, the output of the logic gate 604 (e.g., the set_latch signal) transitions from a logic low value to a logic high value causing the output of the logic circuit 606 (e.g., the single_shot signal) to transition from a logic low value to a logic high value.

In the illustrated example of FIG. 9, between the twelfth time 908 and the thirteenth time 910, the example seventh curve 802 remains at a logic high value, the example eighth curve 804 oscillates between a logic high value and a logic low value at a period defined by the duration of the adaptive delay circuit 622 of FIG. 6 and the duration of the delay circuit 610. Moreover, between the twelfth time 908 and the thirteenth time 910, the duration of the pulse (e.g., the duration of the logic high value) is the duration of the adaptive delay circuit 622 of FIG. 6 and the duration of the delay circuit 610 of FIG. 6. Additionally, between the twelfth time 908 and the thirteenth time 910, the single_shot signal is at a logic low value for the duration of the adaptive delay circuit 622 of FIG. 6 and the duration of the delay circuit 610 of FIG. 6.

In the example of FIG. 9, between the twelfth time 908 and the thirteenth time 910, the example eleventh curve 810 oscillates between a logic low value and a logic high value at a period defined by the duration of the delay circuit 610 and the adaptive delay circuit 622 of FIG. 6, and the example twelfth curve 902 oscillates between a logic high value and a logic low value at a period defined by twice the duration of the adaptive delay circuit 622 of FIG. 6. In the example, between the twelfth time 908 and the thirteenth time 910, the duration of the adaptive delay circuit 622 is adjusted based on the trim_synced signal output by the logic circuit 616 of FIG. 6.

In the illustrated example of FIG. 9, at the thirteenth time 910, the example seventh curve 802 transitions from a logic high value to a logic low value, the example eighth curve 804 remains at a logic high value, the example eleventh curve 810 remains at a logic low value, and the example twelfth curve 902 transitions from a logic high value to a logic low value. At the thirteenth time 910, the reference_pulse signal and the adaptation_pulse signal are at logic low values, causing the trigger signal to transition from a logic high value to a logic low value.

In the illustrated example of FIG. 9, after the thirteenth time 910, the example seventh curve 802 remains at a logic low value, the example eighth curve 804 remains at a logic high value until the example eleventh curve 810 transitions from a logic low value to a logic high value, the example eleventh curve 810 remains at a logic low value until the output of the adaptive delay circuit 622 (e.g., the adapt_delay signal) transitions from a logic low value to a logic high value, and the example twelfth curve 902 remains at a logic low value.

Figure 10:
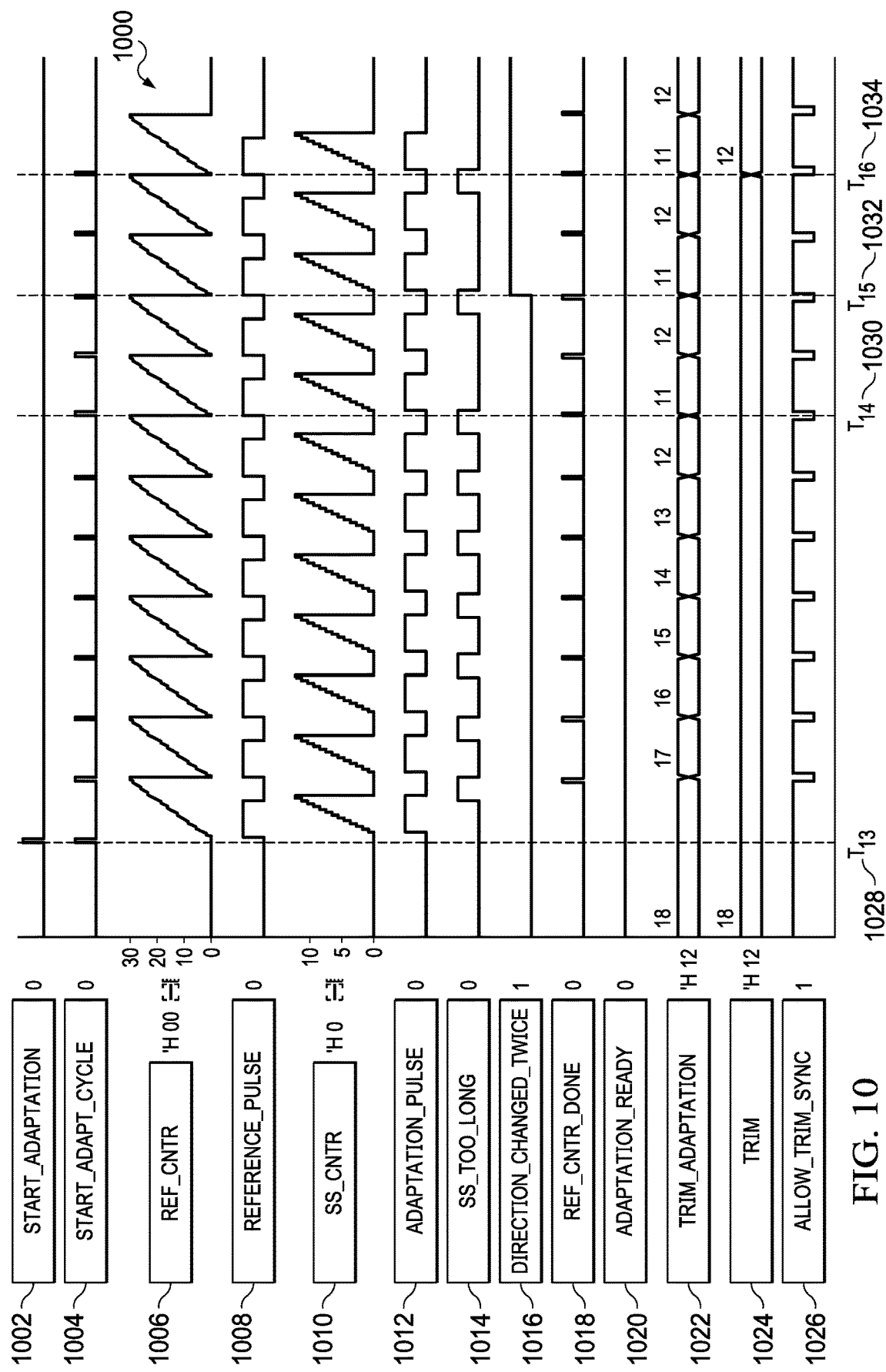
FIG. 10 is a timing diagram illustrating various example signals associated with the core control circuit of FIGS. 1 and 5.

FIG. 10 is a timing diagram 1000 illustrating various example signals associated with the core control circuit 102 of FIGS. 1 and 5. The example timing diagram 1000 includes an example thirteenth curve 1002, an example fourteenth curve 1004, an example fifteenth curve 1006, an example sixteenth curve 1008, an example seventeenth curve 1010, an example eighteenth curve 1012, an example nineteenth curve 1014, an example twentieth curve 1016, an example twenty-first curve 1018, an example twenty-second curve 1020, an example twenty-third curve 1022, an example twenty-fourth curve 1024, an example twenty-fifth curve 1026, an example fourteenth time 1028 ($T_{13}$), an example fifteenth time 1030 ($T_{14}$), an example sixteenth time 1032 ($T_{15}$), and an example seventeenth time 1034 ($T_{16}$).

In the illustrated example of FIG. 10, the example thirteenth curve 1002 represents the start_adaptation signal of FIGS. 5A and 5B, the example fourteenth curve 1004 represents the start_adapt_cycle signal of FIGS. 5A and 5B, the example fifteenth curve 1006 count value determined by the sequencer 504 of FIGS. 5A and 5B, the example sixteenth curve 1008 represents the reference_pulse signal of FIGS. 5A and 5B, the example seventeenth curve 1010 represents the count value determined by single_shot counter 552 of FIGS. 5A and 5B, the example eighteenth curve 1012 represents the adaptation_pulse signal of FIGS. 5A and 5B, the example nineteenth curve 1014 represents the ss_too_long signal of FIGS. 5A and 5B, the example twentieth curve 1016 represents a direction_changed_twice signal generated by the ready detector 542 of FIGS. 5A and 5B, the example twenty-first curve 1018 represents the ref_cntr_done signal of FIGS. 5A and 5B, the example twenty-second curve 1020 represents the adaptation_ready signal of FIGS. 5A and 5B, the example twenty-third curve 1022 represents the trim_adaptation signal of FIGS. 5A and 5B, the example twenty-fourth curve 1024 represents the trim signal of FIGS. 5A and 5B, and the example twenty-fifth curve 1026 represents the allow_trim_sync signal of FIGS. 5A and 5B.

In the illustrated example of FIG. 10, prior to the fourteenth time 1028, each of the example thirteenth curve 1002, the example fourteenth curve 1004, the example fifteenth curve 1006, the example sixteenth curve 1008, the example seventeenth curve 1010, the example eighteenth curve 1012, the example nineteenth curve 1014, the example twentieth curve 1016, the example twenty-first curve 1018, and the example twenty-second curve 1020 is at a logic low value. Prior to the fourteenth time 1028, the example twenty-third curve 1022 is at a binary count value (e.g., a binary count value representative of 18 in decimal) greater than the count value associated with the single_shot counter 552, the example twenty-fourth curve 1024 is at a binary value associated with a previous iteration of the core control circuit 102, and the example twenty-fifth curve 1026 is at a logic high value.

In the illustrated example of FIG. 10, at the fourteenth time 1028, the example thirteenth curve 1002 transitions from a logic low value to a logic high value. For example, at the fourteenth time 1028, the start detector 502 of FIGS. 5A and 5B detects a pulse generated by the refresh pulse generator 500 of FIGS. 5A and 5B. In such an example, the start detector 502 of FIGS. 5A and 5B generates a pulse as the start_adaptation signal. In the example, at the fourteenth time 1028, the fourteenth curve 1004 transitions from a logic low value to a logic high value. For example, the example sequencer 504, at the fourteenth time 1028 generates a pulse as the start_adapt_cycle signal causing the adaptation cycle to begin. In such an example, the sequencer 504 controls the reference_pulse generator 506 that generates the reference_pulse signal.

In the illustrated example of FIG. 10, after the fourteenth time 1028, the example eighteenth curve 1012 and the example sixteenth curve 1008 oscillate between logic high values and logic low value at periods determined by the example adaptation pulse generator 544 and the example reference pulse generator 506, respectively. For example, the example adaptation pulse generator 544 generates the adaptation_pulse signal based on the reference pulse (e.g., the reference_pulse signal), the clk_single_shot signal, and the count value associated with the single_shot counter 552. Additionally, in such an example, the reference pulse generator 506 generates the reference_pulse signal based on the start_adapt_cycle signal and the ref_pulse_done signal.

In the illustrated example of FIG. 10, the time between the fourteenth time 1028 and the fifteenth time 1030 is representative of the reference pulse generator 506 and the adaptation pulse generator 544 generating the reference_pulse signal and the adaptation_pulse signal, respectively. In the example, the time between the fourteenth time 1028 and the fifteenth time 1030, is representative of the pulse comparator 514 comparing the adaptation_pulse (e.g., the adaptation_pulse signal) and the reference_pulse (e.g., the reference_pulse signal) and adjusting the count value of the counter 526 of FIGS. 5A and 5B. In the illustrated example of FIG. 10, the adjusting of the counter 526 is represented by the decreasing value of the twenty-third curve 1022. In such an example, when the duration of the adaptation_pulse signal is greater than the duration of the reference_pulse signal, the pulse comparator 514 decrements the count value of the counter 526. The count value of the counter 526 (e.g., the trim_adaptation signal) adjusts the duration of the clk_single_shot signal which affects the amount of time elapsed while the single_shot counter 552 counts a predetermined number of clock cycles.

In the illustrated example of FIG. 10, between the fifteenth time 1030 and the sixteenth time 1032, the duration of the adaptation_pulse signal on the eighteenth curve 1012 oscillates between less than the duration of the reference_pulse signal on the sixteenth curve 1008 and greater than the duration of the reference_pulse signal on the sixteenth curve 1008. For example, at the fifteenth time 1030, the example pulse comparator 514 outputs a logic high value on the ss_too_long signal to the example counter 526. In such an example, at the next time the counter 526 updates the count value (e.g., at the next rising edge of the ref_cntr_done signal), the output of the example pulse comparator 514 is a logic low value.

In the illustrated example of FIG. 10, at the sixteenth time 1032, the example twentieth curve 1016 transitions from a logic low value to a logic high value. For example, at the sixteenth time 1032, the ready detector 542 detects the change in direction or a sequence of decrementing and then incrementing the value of the twenty-third curve 1022 and outputs a logic high value on the direction_changed_twice signal. In such an example, the direction_changed_twice signal is internal to the example ready detector 542 and causes the example ready detector 542 to monitor for the next logic high value on the ss_too_long signal. Monitoring for the next logic high value corresponds to the delay time that passes to allow the duration of the adaptation_pulse signal on the eighteenth curve 1012 to be greater than the duration of the reference_pulse signal on the sixteenth curve 1008 by the duration associated with one of the delay circuits in the adaptive delay circuit 622 (e.g., the delay circuit 704, the delay circuit 710, the delay circuit 716, etc.). After detecting a logic high value on the ss_too_long signal that follows an alternating sequence of logic values on the ss_too_long signal, a trigger event has been detected.

In the illustrated example of FIG. 10, at the seventeenth time 1034, the example twenty-second curve 1020 transitions from a logic low value to a logic high value. At the seventeenth time 1034, the example twenty-fourth curve 1024 transitions from the binary value associated with a previous iteration of the core control circuit 102 to the binary value associated with the current iteration of the core control circuit 102 (e.g., a binary value corresponding to a decimal value of 12).

In the illustrated example of FIG. 10, between the fourteenth time 1028 and the seventeenth time 1034, the example twenty-fifth curve 1026 oscillates between a logic high value and a logic low value at a period determined by the example sequencer 504 of FIGS. 5A and 5B. For example, the example sequencer 504 outputs the allow_trim_sync signal on the example twenty-fifth curve 1026. In this manner, the example sequencer 504 allows the trim signal to be received by the example second single shot circuit 108b, the example third single shot circuit 108c, the example fourth single shot circuit 108d, and the example fifth single shot circuit 108e. In the illustrated example of FIG. 10, after the seventeenth time 1034, the adaptation process continues whenever a pulse is detected by the start detector 502. In the example, this is illustrated as a pulse on the thirteenth curve 1002.

Figure 11:
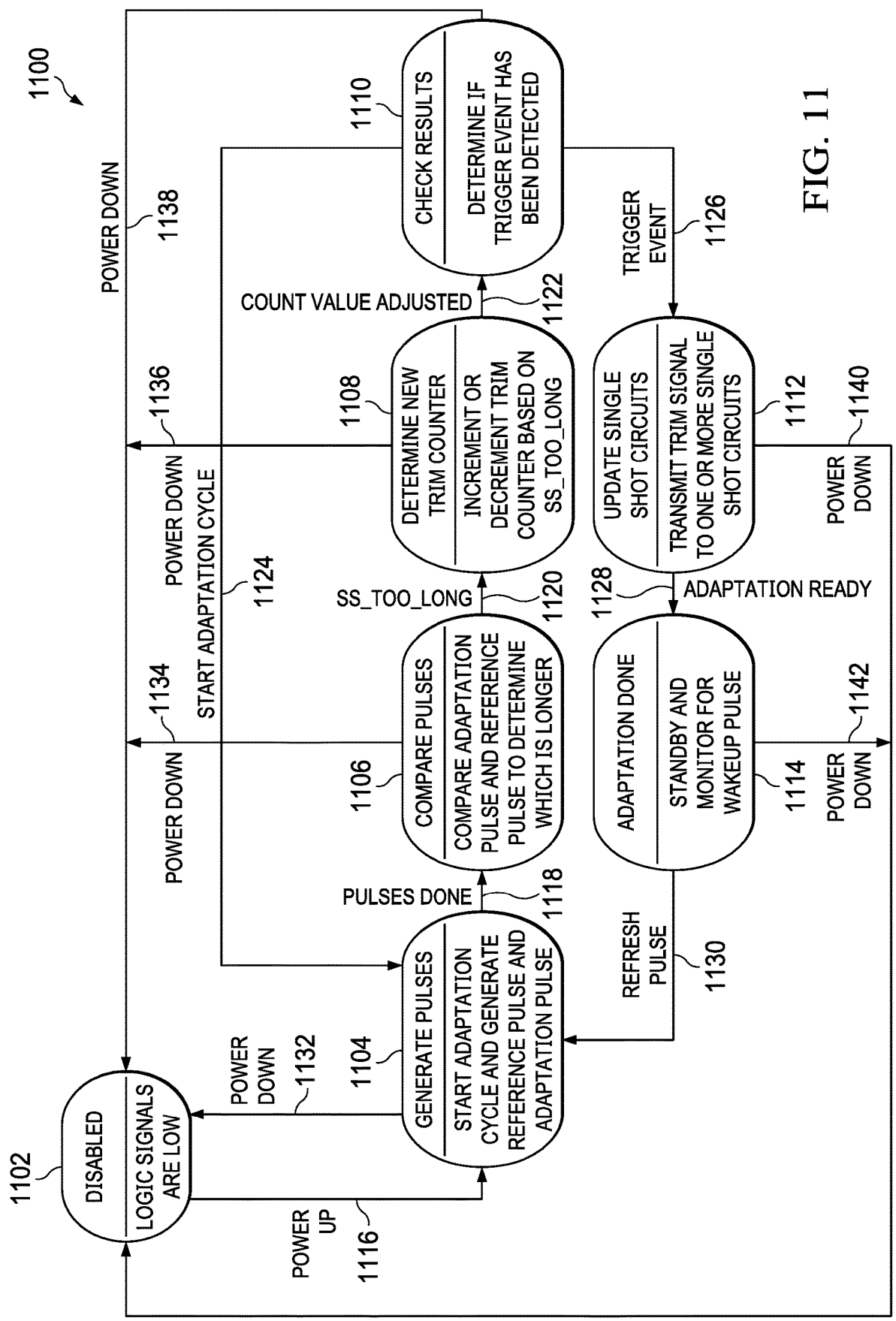
FIG. 11 is a state diagram illustrating example states associated with the core control circuit of FIGS. 1 and 5.

FIG. 11 is a state diagram 1100 illustrating example states associated with the core control circuit 102 of FIGS. 1 and 5. The example state diagram includes an example first state 1102, an example second state 1104, an example third state 1106, an example fourth state 1108, an example fifth state 1110, an example sixth state 1112, and an example seventh state 1114.

In the illustrated example of FIG. 11, When in an example first state 1102, the example single_shot trimmer 106 is in an example disabled mode (e.g., powered down). The example first state 1102 includes a first operating condition 1116. The first operating condition 1116 determines whether the example single_shot trimmer 106 leaves the example first state 1102. In the example first state 1102, the single_shot trimmer 106 the logic signals in the example single_shot trimmer 106 are logic low values. Once power is connected to the single_shot trimmer 106, the first operating condition 1116 is satisfied.

In the illustrated example of FIG. 11, in response to power being connected to the single_shot trimmer 106, the single_shot trimmer 106 enters the example second state 1104 with an example second operating condition 1118. In the example second state 1104, the single_shot trimmer 106 starts the adaptation cycle and generates the reference_pulse signal and the adpatation_pulse signal. More specifically, in the example second state 1104, the example reference pulse generator 506 generates the reference_pulse signal and the adaptation pulse generator 544 generates the adaptation_pulse signal. When the reference_pulse signal and the adaptation_pulse signal have been generated, the example second operating condition 1118 is satisfied.

In the illustrated example of FIG. 11, in response to the reference_pulse signal and the adaptation_pulse signal being generated, the single shot trimmer 106 enters the example third state 1106 with an example third operating condition 1120. In the example third state 1106, the single_shot trimmer 106 compares the duration of the adaptation_pulse signal and the duration of the reference_pulse signal. More specifically, in the example third state 1106, the pulse comparator 514 compares the duration of the adaptation_pulse signal and the duration of the reference_pulse signal. When the single_shot trimmer 106 generates the ss_too_long signal, the example third operating condition 1120 is satisfied.

In the illustrated example of FIG. 11, in response to ss_too_long signal, the single_shot trimmer 106 enters the example fourth state 1108 including an example fourth operating condition 1122. In the example fourth state 1108, the single_shot trimmer 106 determines a new count value for the counter 526. More specifically, in the example fourth state 1108, the example pulse comparator 514 adjusts the count value of the counter 526 by incrementing or decrementing the counter 526 based on the ss_too_long signal. When the ref_cntr_done signal transitions to a logic high value from a logic low value, the output of the counter 526 has been adjusted. The output of the counter 526 (e.g., the trim_adaptation signal) is updated with the adjusted count value at the next rising edge of the clk_sys signal. After adjusting the count value of the counter 526 (e.g., a rising edge on the ref_cntr_done signal), the example fourth operating condition 1122 is satisfied.

In the illustrated example of FIG. 11, in response to adjusting the count value of the counter 526, the single_shot trimmer 106 enters the example fifth state 1110 with an example fifth operating condition 1124 and an example sixth operating condition 1126. In the example fifth state 1110, the single_shot trimmer 106 determines if a trigger event has been detected. More specifically, in the example fifth state 1110, the ready detector 542 determines if the trigger event has been detected. When the single_shot trimmer 106 detects the trigger event, the sixth operating condition 1126 has been satisfied. When the start_adapt_cycle signal transitions from a logic low value to a logic high value, the example fifth operating condition 1124 is satisfied. In response to a rising edge on the start_adapt_cycle signal, the example single_shot trimmer 106 enters the example second state 1104.

In the illustrated example of FIG. 11, in response to detecting the trigger event, the single_shot trimmer 106 enters the example sixth state 1112 with an example seventh operating condition 1128. In the illustrated example, the single_shot trimmer 106 executes the second state 1104 after the fifth operating condition 1124 is satisfied. The example single_shot trimmer 106 executes the sixth state 1112 after the sixth operating condition 1126 is satisfied. In the example sixth state 1112, the single_shot trimmer 106 transmits the trim signal to one or more single shot circuits. When the single_shot trimmer 106 transmits the trim signal to the one or more single shot circuits, the single_shot trimmer 106 generates the adaptation_ready signal. When the single_shot trimmer 106 generates the adaptation_ready signal, the seventh operating condition 1128 has been satisfied.

In the illustrated example of FIG. 11, in response to detecting the adaptation_ready signal, the example single_shot trimmer 106 enters the example seventh state 1114 including an example eighth operating condition 1130. In the example seventh state 1114, the single_shot trimmer 106 monitors for the refresh pulse. More specifically, in the example seventh state 1114, the example start detector 502 monitors for the example refresh pulse generated by the refresh pulse generator 500. When the refresh pulse is detected, the example eighth operating condition 1130 is satisfied and the single_shot trimmer 106 enters the example second state 1104.

In the illustrated example of FIG. 11, each of the example second state 1104, the example third state 1106, the example fourth state 1108, the example fifth state 1110, the example sixth state 1112, and the example seventh state 1114 includes an example ninth operating condition 1132, an example tenth operating condition 1134, an example eleventh operating condition 1136, an example twelfth operating condition 1138, an example thirteenth operating condition 1140, an example fourteenth operating condition 1142, respectively. In the example, each of the ninth operating condition 1132, the tenth operating condition 1134, the eleventh operating condition 1136, the twelfth operating condition 1138, the thirteenth operating condition 1140, and the fourteenth operating condition 1142 determines whether the example single_shot trimmer 106 returns to the first state 1102 from the second state 1104, the third state 1106, the fourth state 1108, the fifth state 1110, the sixth state 1112, and the seventh state 1114, respectively. When the single_shot trimmer 106 is disconnected from power, each of the ninth operating condition 1132, the tenth operating condition 1134, the eleventh operating condition 1136, the twelfth operating condition 1138, the thirteenth operating condition 1140, and the fourteenth operating condition 1142 is satisfied and the single_shot trimmer 106 returns to the first state 1102 from the second state 1104, the third state 1106, the fourth state 1108, the fifth state 1110, the sixth state 1112, and the seventh state 1114, respectively.

While an example manner of implementing the example core control circuit 106 of FIG. 1 is illustrated in FIGS. 5A and 5B, one or more of the elements, processes and/or devices illustrated in FIGS. 5A and 5B may be combined, divided, re-arranged, omitted, eliminated and/or implemented in any other way. Further, the example refresh pulse generator 500, the example start detector 502, the example sequencer 504, the example reference pulse generator 506, the example pulse comparator 514, the example counter 526, the example trim dispatcher 536, the example ready detector 542, the example adaptation_pulse generator 544, the example single_shot counter 552, the example one of the single shot circuits 108a, 108b, 108c, 108d, 108e and/or, more generally, the example core control circuit 102 of FIGS. 5A and 5B may be implemented by hardware, software, firmware and/or any combination of hardware, software and/or firmware. Thus, for example, any of the example refresh pulse generator 500, the example start detector 502, the example sequencer 504, the example reference pulse generator 506, the example pulse comparator 514, the example counter 526, the example trim dispatcher 536, the example ready detector 542, the example adaptation pulse generator 544, the example single_shot counter 552, the example one of the single shot circuits 108a, 108b, 108c, 108d, 108e and/or, more generally, the example core control circuit 102 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example refresh pulse generator 500, the example start detector 502, the example sequencer 504, the example reference pulse generator 506, the example pulse comparator 514, the example counter 526, the example trim dispatcher 536, the example ready detector 542, the example adaptation pulse generator 544, the example single_shot counter 552, the example one of the single shot circuits 108a, 108b, 108c, 108d, 108e is/are hereby expressly defined to include a non-transitory computer readable storage device or storage disk such as a memory, a digital versatile disk (DVD), a compact disk (CD), a Blu-ray disk, etc. including the software and/or firmware. Further still, the example core control circuit 102 of FIGS. 5A and 5B may include one or more elements, processes and/or devices in addition to, or instead of, those illustrated in FIGS. 5A and 5B, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 12A:
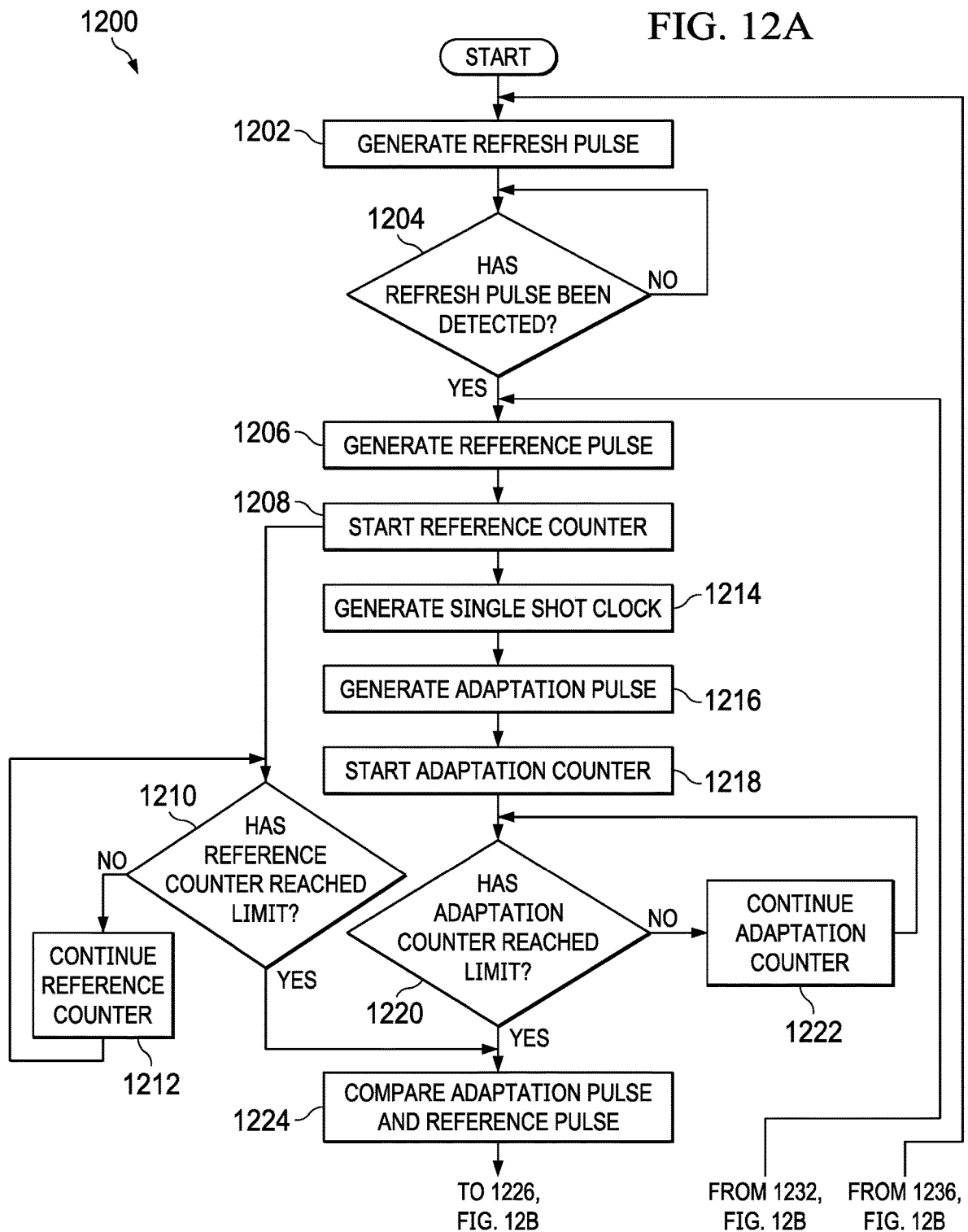
FIGS. 12A and 12B are flowcharts representative of a process that may be carried out by machine readable instructions, which may be executed to implement the core control circuit of FIGS. 1 and 5.
Figure 12B:
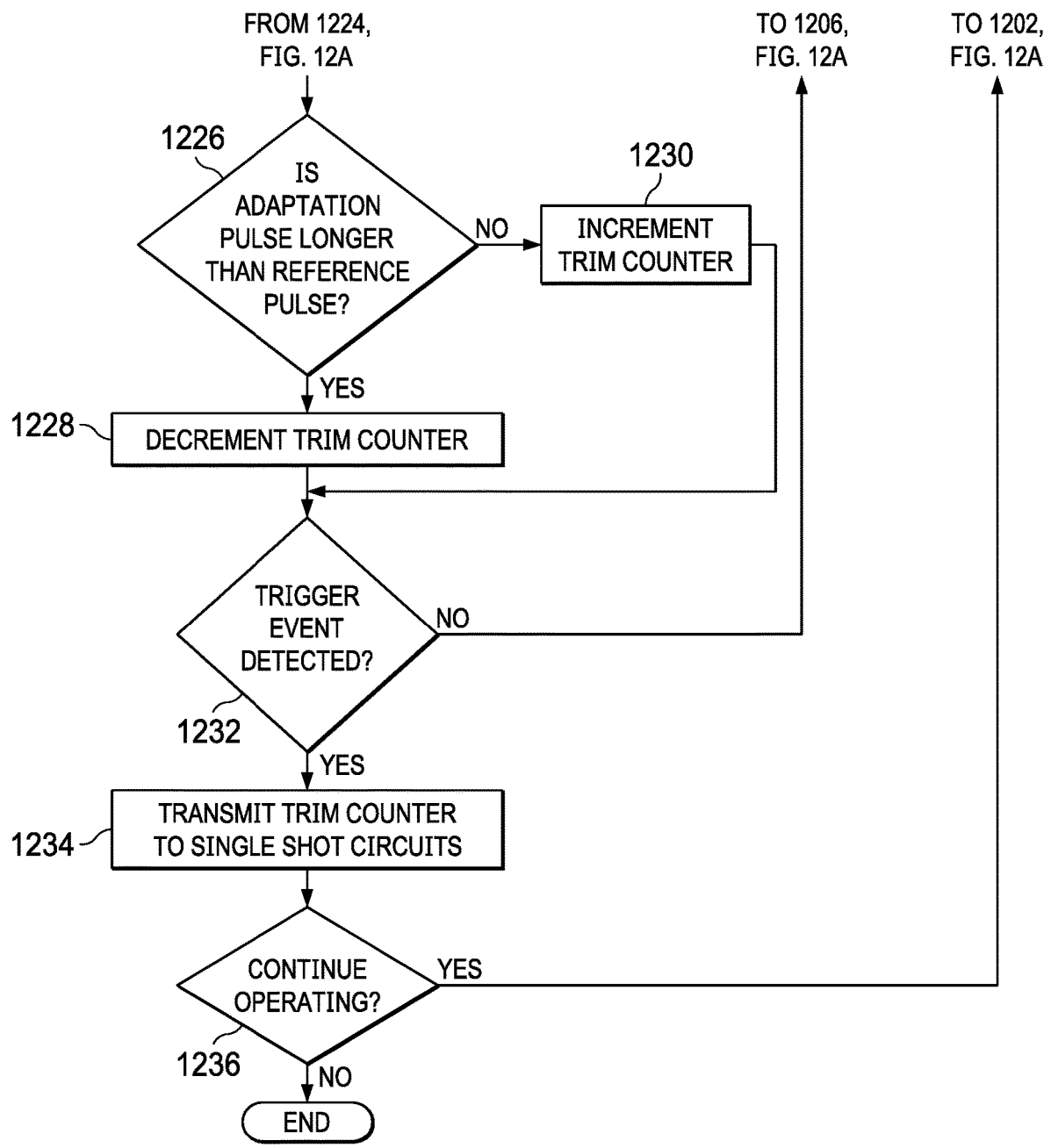

A flowchart representative of example hardware logic, machine readable instructions, hardware implemented state machines, and/or any combination thereof for implementing the core control circuit 102 of FIGS. 5A and 5B is shown in FIGS. 12A and 12B. The machine readable instructions may be one or more executable programs or portion(s) of an executable program for execution by a computer processor. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than a processor and/or embodied in firmware or dedicated hardware. Further, although the example program is described with reference to the flowchart illustrated in FIGS. 12A and 12B, many other methods of implementing the example core control circuit 102 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example processes of FIGS. 12A and 12B may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIGS. 12A and 12B are flowcharts representative of a process that may be carried out by machine readable instructions, which may be executed to implement the core control circuit 102 of FIGS. 1 and 5. The program 1200 of FIGS. 12A and 12B begins at block 1202 where the refresh pulse generator 500 of FIGS. 5A and 5B generates the refresh pulse. At block 1204, the example start detector 502 determines whether the refresh pulse has been detected. If the start detector 502 does not detect the refresh pulse (block 1204: NO), the program 1200 continues to monitor the example refresh pulse generator 500. If the start detector 502 does detect the refresh pulse (block 1204: YES), the program 1200 continues to block 1206. At block 1206, the reference_pulse generator 506 generates the reference_pulse signal based on the start_adapt_cycle signal and the ref_pulse_done signal generated by the sequencer 504.

In the illustrated example of FIGS. 12A and 12B, at block 1208, the sequencer 504 starts a reference counter. For example, at block 1208, the sequencer 504 counts a number of clock cycles on the CLK_SYS signal. After block 1208, the program 1200 proceeds to block 1210 and block 1214. At block 1210, the example sequencer 504 determines whether the number of clock cycles on the CLK_SYS signal has reached a first count value associated with the duration of the reference_pulse signal. If the sequencer 504 determines that the number of clock cycles on the CLK_SYS signal has reached the first count value (block 1210: YES), the program 1200 proceeds to block 1224. If the sequencer 504 determines that the number of clock cycles on the CLK_SYS signal has not reached the first count value (block 1210: NO), the program 1200 proceeds to block 1212 where the sequencer 504 continues to count the number of clock cycles on the CLK_SYS signal. After block 1212, the program 1200 proceeds to block 1210.

In the illustrated example of FIGS. 12A and 12B, at block 1214, the first single shot circuit 108a generates the single_shot clock (e.g., the clk_single_shot signal). For example, at block 1214, the first single shot circuit 108a generates the single_shot clock based on the adaptive delay circuit 622. At block 1216, the adaptation pulse generator 544 generates the adaptation_pulse signal based on control signals from the single_shot counter 552. At block 1218, starts an adaptation counter. For example, at block 1218, the single_shot counter 552 counts a number of clock cycles on the clk_single_shot signal.

In the illustrated example of FIGS. 12A and 12B, at block 1220, the example single_shot counter 552 determines whether the number of clock cycles on the clk_single_shot signal has reached a second count value associated with the duration of the adaptation_pulse signal. If the single_shot counter 552 determines that the number of clock cycles on the clk_single_shot signal has reached the second count value (block 1220: YES), the program 1200 proceeds to block 1224. If the single_shot counter 552 determines that the number of clock cycles on the clk_single_shot signal has not reached the second count value (block 1220: NO), the program 1200 proceeds to block 1222 where the single_shot counter 552 continues to count the number of clock cycles on the clk_single_shot signal.

In the illustrated example of FIGS. 12A and 12B, at block 1224, the example pulse comparator 514 compares the adaptation_pulse signal and the reference_pulse signal. At block 1226, the example pulse comparator 514 determines whether the duration of the adaptation_pulse signal exceeds the duration of the reference_pulse signal. If the example pulse comparator 514 determines that the duration of the adaptation_pulse signal exceeds the duration of the reference_pulse signal (block 1226: YES), the program 1200 proceeds to block 1228 where the example pulse comparator 514 adjusts the count value of the counter 526 by decrementing the count value. After block 1228, the program 1200 proceeds to block 1232. If the example pulse comparator 514 determines that the duration of the adaptation_pulse signal does not exceed the duration of the reference_pulse signal (block 1226: NO), the program 1200 proceeds to block 1230.

In the illustrated example of FIGS. 12A and 12B, at block 1230, the example pulse comparator 514 adjusts the count value of the counter 526 by incrementing the count value.

In the illustrated example of FIGS. 12A and 12B, at block 1232, the example ready detector 542 determines whether a trigger event has been detected. For example, at block 1234, the example ready detector 542 determines whether a logic high value has occurred following an alternating sequence of logic values on the ss_too_long signal. If the example ready detector 542 determines that the trigger event has been detected (block 1232: YES), the program 1200 proceeds to block 1234. If the example ready detector 542 determines that the trigger event has not been detected (block 1232: NO), the program 1200 proceeds to block 1206 where the reference pulse generator 506 generates the reference_pulse signal.

In the illustrated example of FIGS. 12A and 12B, at block 1234, in response to a trigger event, the ready detector 542 sets the adaptation_ready signal to a logic high value, causing the trim dispatcher 536 to transmit the trim signal to one or more single shot circuits operating in a first operational mode. At block 1236, the example refresh pulse generator 500 determines whether to continue operating. For example, a condition that may cause the example refresh pulse generator 500 to determine not continue operating is power being disconnected from the core control circuit 102. If the example refresh pulse generator 500 determines to continue operating (block 1236: YES), the program 1200 proceeds to block 1202 where the example refresh pulse generator 500 generates the refresh pulse signal. If the example refresh pulse generator 500 determines not to continue operating (block 1236: NO), the program 1200 ends.

From the foregoing, it will be appreciated that example methods, apparatus and articles of manufacture have been disclosed that adapt the duration of single_shot signals to blank sensed signals in a power converter. The adapted single_shot signals allow single shot circuits to accurately bypass the sensed signals in a power converter. This adapted single_shot signal is advantageous to a load. For example, an improperly adapted blanking period (e.g., too short or too long) can cause false sensing of signals, perturbations in output voltage, limited output current capability, damage to a power converter, false interrupt signals that interrupt power delivery to the load, duty ratio limitations, switching frequency limitations, higher ripple voltage on the output voltage, additional noise in a control system. For example, in a RADAR subsystem in an automotive vehicle, very high switching frequencies are used in a power converter to supply power to a RADAR subsystem to generate the RADAR signals. In such an example, the RADAR subsystem functions more advantageously to a user if the input voltage source has low ripple voltage. Beneficially, an adapted single shot signal reduces ripple voltage on the output of a power converter. Additionally, an example RADAR subsystem operates more advantageously to a user if the input switching frequency is outside of normal radio bandwidths (e.g., AM frequency, FM frequency, etc.). With an improperly adapted single_shot signal, sufficiently high switching frequencies are not achievable for use in a RADAR subsystem; however, with an adapted single_shot signal, the high switching frequency that is beneficial to a user of a RADAR subsystem are achievable. Furthermore, higher switching frequencies allow for small inductors values (e.g., inductor value <220 nH) that are physically smaller than other inductors to be used in a power converter. The smaller value improves load transient performance and the smaller size decreases the footprint of an inductor in a PCB or other circuit. The disclosed methods, apparatus and articles of manufacture improve the efficiency of using a computing device by reducing the computational waste associated with false sensing of signals, increasing the operating range of a power converter, and improving the efficiency of a power converter. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
 a first single shot circuit including an adaptive delay element, first and second inputs, and an output, the first input of the first single shot circuit coupled to a reference pulse generator and the output of the first single shot circuit coupled to an adaptive pulse generator;

a pulse comparator including first and second inputs and an output, the first input of the pulse comparator coupled to the reference pulse generator, the second input of the pulse comparator coupled to the adaptive pulse generator; and a counter including a first input and an output, the first input of the counter coupled to the output of the pulse comparator, the output of the counter coupled to the first input of the first single shot circuit.

2. The apparatus of claim 1, further including:

the reference pulse generator including first and second inputs and an output, the output of the reference pulse generator coupled to the pulse comparator;

the adaptive pulse generator including first and second inputs and an output, the first input of the adaptive pulse generator coupled to the output of the reference pulse generator, the second input of the adaptive pulse generator coupled to the output of the first single shot circuit;

a dispatcher including first and second inputs and an output, the first input of the dispatcher coupled to the output of the counter, the output of the dispatcher coupled to an input of the second single shot circuit; and a ready detector including a first input and an output, the first input of the ready detector coupled to the output of the pulse comparator, and the output of the ready detector coupled to the second input of the dispatcher;

a refresh pulse generator including an output; and a sequencer including an input and first and second outputs, the input of the sequencer coupled to the output of the refresh pulse generator, the first and second inputs of the first pulse generator coupled to the first and second outputs of the sequencer.

3. The apparatus of claim 2, in which the pulse comparator includes a third input and the sequencer includes a third output, the third input of the pulse comparator coupled to the third output of the sequencer.

4. The apparatus of claim 2, in which the counter includes a second input and the sequencer includes a third output, the second input of the counter coupled to the third output of the sequencer.

5. The apparatus of claim 2, in which the ready detector includes second and third input and the sequencer includes a third output, the second input of the ready detector coupled to the first output of the sequencer, the third input of the ready detector coupled to the third output of the sequencer.

6. The apparatus of claim 2, in which the counter is a first counter and the second pulse generator includes a third input, the apparatus including a second counter including first and second inputs and first and second outputs, the first input of the second counter coupled to the output of the first pulse generator, the second input of the second counter coupled to the output of the first single shot circuit, the first output of the second counter coupled to the first input of the second pulse generator, and the second output of the second counter coupled to the third input of the second pulse generator.

7. The apparatus of claim 1 including:

a switch node adapted to be coupled to a load;

current sense circuitry having an input coupled to the switch node and having a current sense output;

logic circuitry having a first input coupled to the current sense output, having a second, blanking input, and having a blanked current sense output; and converter control circuitry having an input coupled to the blanked current sense output and having a trigger high side output.

8. The apparatus of claim 7 in which the converter control circuitry has a trigger low side output.

9. The apparatus of claim 8 including an OR gate having first and second OR gate inputs and an output coupled to the second, blanking input.

10. The apparatus of claim 9 including latch circuitry having a first input coupled to the first OR gate input, having a second input coupled to the second OR gate input, and having an active output.

11. The apparatus of claim 10 including gate driver circuitry having an input coupled to the active output, having a high side gate output, and having a low side gate output.

12. The apparatus of claim 11 including a high side transistor having a drain coupled to an input voltage, having a gate coupled to the high side gate output, and having a source coupled to the switch node.

13. The apparatus of claim 11 including a low side transistor having a drain coupled to the switch node, having a gate coupled to the low side gate output, and having a source coupled to a ground.

14. The apparatus of claim 7 including an inductor having a first terminal coupled to the switch node and having an output voltage terminal; and a load coupled to the output voltage terminal.

15. The apparatus of claim 14 in which the load is an automotive subsystem.

* * * * *